(12) United States Patent
Kawano

(10) Patent No.: US 11,105,771 B2
(45) Date of Patent: Aug. 31, 2021

(54) MAGNETIC FIELD GENERATION DEVICE, MEASUREMENT CELL, ANALYSIS APPARATUS, AND PARTICLE SEPARATION DEVICE

(71) Applicant: KAWANO Lab. Inc., Osaka (JP)

(72) Inventor: Makoto Kawano, Ikeda (JP)

(73) Assignee: KAWANO Lab. Inc., Osaka (JP)

( * ) Notice: Subject to any disclaimer, the term of this patent is extended or adjusted under 35 U.S.C. 154(b) by 103 days.

(21) Appl. No.: 16/469,519

(22) PCT Filed: Dec. 15, 2017

(86) PCT No.: PCT/JP2017/045134
§ 371 (c)(1),
(2) Date: Jun. 13, 2019

(87) PCT Pub. No.: WO2018/110699
PCT Pub. Date: Jun. 21, 2018

(65) Prior Publication Data
US 2020/0088683 A1    Mar. 19, 2020

(30) Foreign Application Priority Data
Dec. 16, 2016 (JP) .............................. JP2016-244437

(51) Int. Cl.
*G01N 27/76* (2006.01)
*G01N 27/447* (2006.01)
*G01R 33/16* (2006.01)

(52) U.S. Cl.
CPC ....... *G01N 27/76* (2013.01); *G01N 27/44786* (2013.01); *G01R 33/16* (2013.01)

(58) Field of Classification Search
CPC .. G01N 27/76; G01N 27/44786; G01N 27/26; G01R 33/16; G01R 33/1276
See application file for complete search history.

(56) References Cited

U.S. PATENT DOCUMENTS 3,879,658 A * 4/1975 Hummel ................ G01N 27/74
324/201
5,516,670 A     5/1996 Kuehnle et al.
(Continued)

FOREIGN PATENT DOCUMENTS

| CN | 2925614 | * | 7/2007 |
| JP | 2002-071645 A | | 3/2002 |
| JP | 2013-253882 A | | 12/2013 |

OTHER PUBLICATIONS

International Search Report issued in PCT/JP2017/045134; dated Feb. 20, 2018.

*Primary Examiner* — Thang X Le
(74) *Attorney, Agent, or Firm* — Studebaker & Brackett PC

(57) ABSTRACT

A magnetic field generation device (100) includes a first magnet (1), a second magnet (2), and a position adjustment mechanism (5). The second magnet (2), together with the first magnet (1), generates a magnetic field. The position adjustment mechanism (5) adjusts a position of the first magnet (1). The magnetic field generation device (100) controls the value of the product of a magnetic flux density and a magnetic flux density gradient in the magnetic field through the adjustment of the position of the first magnet (1) by the position adjustment mechanism (5).

14 Claims, 18 Drawing Sheets

(56) References Cited

U.S. PATENT DOCUMENTS

2004/0249262 A1\* 12/2004 Werp ............... A61B 90/10
  600/411
2010/0219814 A1\* 9/2010 Nishiura ............ G01D 5/145
  324/207.24
2011/0140819 A1\* 6/2011 Kazadi ............. F16C 39/063
  335/285

\* cited by examiner

MAGNETIC FIELD GENERATION DEVICE, MEASUREMENT CELL, ANALYSIS APPARATUS, AND PARTICLE SEPARATION DEVICE

TECHNICAL FIELD

The present invention relates to magnetic field generation devices, measurement cells, analysis apparatuses, and particle separation devices.

BACKGROUND ART

The present inventor et al. have in the past developed a magnetic susceptibility measurement device for measuring the volume magnetic susceptibility of a particle p (see Patent Literature 1). That magnetic susceptibility measurement device is provided with a magnetophoresis generation section. The magnetophoresis generation section includes two magnets and a housing for accommodating the two magnets. The housing includes two accommodation portions and two linkage portions. The two accommodation portions each accommodate one of the two magnets. The two linkage portions link the two accommodation portions together with a space formed between the two accommodation portions.

In order to allow magnetophoresis of a particle p, it is necessary to generate a magnetic field having a magnetic flux density of as great as several teslas (T). It is also necessary to set the width of the space between the two accommodation portions to as short as not less than 0.4 mm and not more than 1 mm so as to generate a great magnetic field gradient (magnetic flux density gradient). The two linkage portions firmly fix the two accommodation portions so that the width of the space between the two accommodation portions (i.e., the distance between the two magnets) is maintained.

CITATION LIST

Patent Literature

Patent Literature 1
Japanese Patent Application Laid-Open Publication No. 2013-253882

SUMMARY OF INVENTION

Technical Problem

In order to calculate the volume magnetic susceptibility of a particle p, it is necessary to subject the particle p to magnetophoresis and obtain the magnetophoretic velocity of the particle p. The magnetophoretic velocity depends on the particle size of the particle p. Specifically, the magnetophoretic velocity depends on the radius of the particle p. Therefore, in order to detect the magnetophoretic velocity of the particle p, it is necessary to adjust the value of the product of the magnetic flux density and the magnetic flux density gradient according to the particle size of the particle p. For example, even when the value of the product of the magnetic flux density and the magnetic flux density gradient is the same, the magnetophoretic velocity of a particle p having a particle size of as large as about several hundreds of micrometers is significantly greater than that of a nanoscale particle p having a particle size of not less than 1 nm and less than 1 μm. This may make it difficult to detect the magnetophoretic velocity of a large particle p. Therefore, for analysis of a large particle, it is necessary to reduce the value of the product of the magnetic flux density and the magnetic flux density gradient.

In the magnetic susceptibility measurement device described in Patent Literature 1, the two linkage portions are magnet-to-magnet distance fixation jigs for fixing the distance between the two magnets. The two accommodation portions are firmly fixed together by the two linkage portions. Therefore, the value of the product of the magnetic flux density and the magnetic flux density gradient cannot be adjusted. Therefore, it is necessary to previously prepare a plurality of types of magnetophoresis generation sections having different values of the product of the magnetic flux density and the magnetic flux density gradient, and find one magnetophoresis generation section that can be used to detect the magnetophoretic velocity. In other words, it is necessary to change the magnets so as to adjust the value of the product of the magnetic flux density and the magnetic flux density gradient.

With the above problem in mind, the present invention has been made. It is an object of the present invention to provide a novel magnetic field generation device capable of controlling the value of the product of the magnetic flux density and the magnetic flux density gradient without changing the magnets. It is another object of the present invention to provide a measurement cell for use in the novel magnetic field generation device, and an analysis apparatus including the novel magnetic field generation device. It is still another object of the present invention to provide a particle separation device configured using the novel magnetic field generation device.

Solution to Problem

A magnetic field generation device according to the present invention includes a first magnet, a second magnet, and a position adjustment mechanism. The second magnet, together with the first magnet, generates a magnetic field. The position adjustment mechanism adjusts a position of the first magnet. The magnetic field generation device controls the value of the product of a magnetic flux density and a magnetic flux density gradient in the magnetic field through the adjustment of the position of the first magnet by the position adjustment mechanism.

In one embodiment, a space between the first and second magnets is open to a space external thereto, except for a direction in which the first and second magnets are aligned.

In one embodiment, the position adjustment mechanism includes a vise and a movable stage. The vise holds a portion of the movable stage, or the first magnet.

In one embodiment, the magnetic field generation device further includes a first protruding piece and a second protruding piece. The first protruding piece protrudes from a surface of the first magnet closer to the second magnet. The second protruding piece protrudes from a surface of the second magnet closer to the first magnet.

In one embodiment, the first and second protruding pieces are a pole piece.

A measurement cell according to the present invention includes a first joint portion and a second joint portion. The first joint portion is joined to the first protruding piece included in the above magnetic field generation device. The second joint portion is joined to the second protruding piece included in the above magnetic field generation device. The measurement cell is supported by the first and second protruding pieces with the first joint portion joined to the first protruding piece and the second joint portion joined to the second protruding piece.

An analysis apparatus according to the present invention includes a migration section, a detection section, and a calculation section. The migration section allows an object to be measured to migrate in a flow channel. The detection section detects a motion of the object to be measured in the flow channel. The calculation section obtains a movement velocity of the object to be measured from the motion of the object to be measured detected by the detection section. The migration section includes the above magnetic field generation device. The detection section detects the motion of the object to be measured during magnetophoresis caused by the magnetic field generated by the magnetic field generation device. The calculation section obtains a magnetophoretic velocity of the object to be measured from the motion of the object to be measured during magnetophoresis detected by the detection section. The calculation section obtains the volume magnetic susceptibility of the object to be measured from the radius and magnetophoretic velocity of the object to be measured.

In one embodiment, the position adjustment mechanism of the magnetic field generation device moves the first magnet further away from the second magnet to a position where the object to be measured is not allowed to undergo magnetophoresis.

In one embodiment, the migration section further includes an electric field generation device. The electric field generation device generates an electric field that allows the object to be measured to undergo electrophoresis.

In one embodiment, the detection section detects a motion of the object to be measured during electrophoresis, in the same region in which the motion of the object to be measured is detected during magnetophoresis. The calculation section obtains an electrophoretic velocity of the object to be measured from the motion of the object to be measured during electrophoresis detected by the detection section. The calculation section obtains the zeta potential of the object to be measured from the electrophoretic velocity.

In one embodiment, the detection section detects a motion of the object to be measured in two regions included in the region where the object to be measured undergoes magnetophoresis.

In one embodiment, the calculation section obtains a first movement velocity of the object to be measured from the motion of the object to be measured in one of the two regions, and obtains a second movement velocity of the object to be measured from the motion of the object to be measured in the other region of the two regions.

In one embodiment, the calculation section obtains the volume magnetic susceptibility of the object to be measured on the basis of a difference between the first and second movement velocities and a difference in the value of the product of the magnetic flux density and the magnetic flux density gradient between the two regions.

In one embodiment, the flow channel extends in a vertical direction. The calculation section obtains a magnetophoretic velocity of the object to be measured in one or the other of the two regions on the basis of the radius and volume magnetic susceptibility of the object to be measured. The calculation section obtains a gravitational settling velocity of the object to be measured on the basis of the first or second movement velocity, and the magnetophoretic velocity of the object to be measured in one or the other of the two regions.

The gravitational settling velocity indicates a velocity at which the object to be measured, receiving a gravitational field-derived force, settles.

In one embodiment, the calculation section obtains the specific gravity or mass of the object to be measured from the gravitational settling velocity.

In one embodiment, the position adjustment mechanism of the magnetic field generation device moves the first magnet further away from the second magnet to a position where the object to be measured is not allowed to undergo magnetophoresis.

In one embodiment, the migration section further includes an electric field generation device. The electric field generation device generates an electric field that allows the object to be measured to undergo electrophoresis.

In one embodiment, the detection section detects a motion of the object to be measured during electrophoresis in the same regions as the two regions. The calculation section obtains an electrophoretic velocity of the object to be measured from a difference between the first and second movement velocities. The calculation section obtains the zeta potential of the object to be measured from the electrophoretic velocity.

In one embodiment, the migration section includes two of the magnetic field generation devices.

In one embodiment, the two magnetic field generation devices generate two magnetic fields having different values of the product of the magnetic flux density and the magnetic flux density gradient.

In one embodiment, the detection section detects a motion of the object to be measured during magnetophoresis in the two regions where the generated magnetic fields exist.

In one embodiment, the calculation section obtains a first movement velocity of the object to be measured from the motion of the object to be measured in one of the two regions, and obtains a second movement velocity of the object to be measured from the motion of the object to be measured in the other region of the two regions.

In one embodiment, the calculation section obtains the volume magnetic susceptibility of the object to be measured on the basis of a difference between the first and second movement velocities and a difference in the value of the product of the magnetic flux density and the magnetic flux density gradient between the two regions.

In one embodiment, the flow channel extends in a vertical direction. The calculation section obtains a magnetophoretic velocity of the object to be measured depending on one of the two magnetic fields, on the basis of the radius and volume magnetic susceptibility of the object to be measured. The calculation section obtains a gravitational settling velocity of the object to be measured on the basis of the first or second movement velocity, and the magnetophoretic velocity of the object to be measured depending on one of the two magnetic fields. The gravitational settling velocity indicates a velocity at which the object to be measured, receiving a gravitational field-derived force, settles.

In one embodiment, the calculation section obtains the specific gravity or mass of the object to be measured from the gravitational settling velocity.

In one embodiment, the position adjustment mechanisms of the two magnetic field generation devices each move the first magnet further away from the second magnet to a position where the object to be measured is not allowed to undergo magnetophoresis.

In one embodiment, the migration section further includes an electric field generation device. The electric field generation device generates an electric field that allows the object to be measured to undergo electrophoresis.

In one embodiment, the detection section detects a motion of the object to be measured during electrophoresis in the same two regions where the magnetic fields are generated. The calculation section obtains an electrophoretic velocity of the object to be measured from a difference between the first and second movement velocities. The calculation section obtains the zeta potential of the object to be measured from the electrophoretic velocity.

A particle separation device according to the present invention includes a first magnet, a second magnet, and a position adjustment mechanism. The second magnet, together with the first magnet, generates a magnetic field. The position adjustment mechanism adjusts a position of the first magnet. The position adjustment mechanism includes a three-axis stage. The particle separation device distorts the magnetic field through the adjustment of the position of the first magnet by the position adjustment mechanism.

Advantageous Effects of Invention

According to the present invention, the value of the product of the magnetic flux density and the magnetic flux density gradient can be adjusted without changing the magnets.

DESCRIPTION OF EMBODIMENTS

Figure 1:
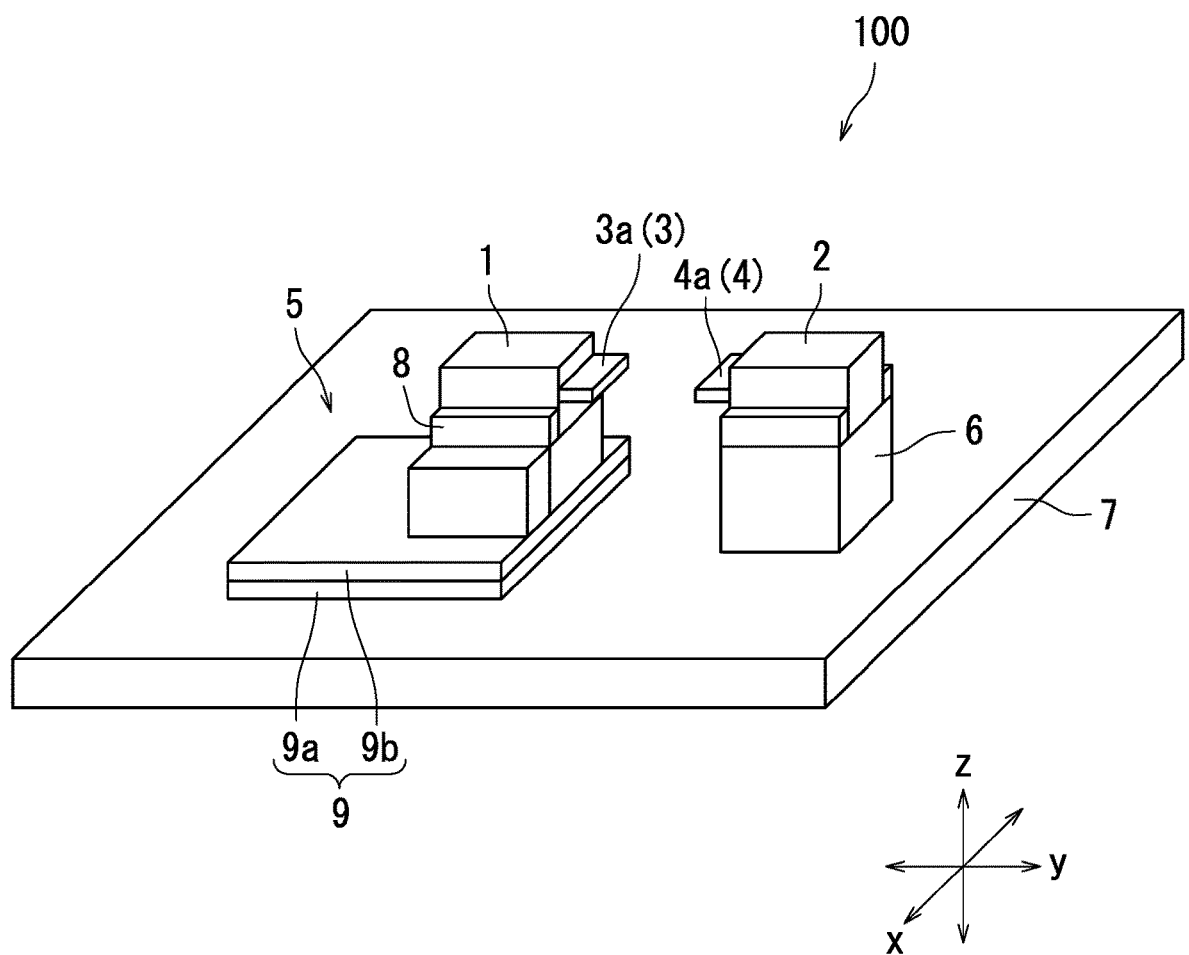
FIG. 1 is a perspective view showing a magnetic field generation device according to a first embodiment of the present invention.

Embodiments of the present invention will now be described with reference to the accompanying drawings. It should be noted that the present invention is in no way limited to the embodiments below. The same or corresponding parts are indicated by the same reference characters and will not redundantly be described.

First Embodiment

An embodiment (first embodiment) of a magnetic field generation device and analysis apparatus according to the present invention will firstly be described with reference to FIGS. 1-5. FIG. 1 is a perspective view showing a magnetic field generation device 100 according to the first embodiment. The magnetic field generation device 100 includes a first magnet 1, a second magnet 2, a first protruding piece 3, a second protruding piece 4, a position adjustment mechanism 5, and a fixation member 6. In this embodiment, the magnetic field generation device 100 is provided on a fixation base 7.

The first and second magnets 1 and 2 are a permanent magnet, and have opposite poles. For example, the first magnet 1 is a north-pole magnet, and the second magnet 2 is a south-pole magnet. Therefore, the first and second magnets 1 and 2 together form a magnetic field.

The first protruding piece 3 protrudes from a surface of the first magnet 1 that is closer to the second magnet 2. The second protruding piece 4 protrudes from a surface of the second magnet 2 that is closer to the first magnet 1. The first and second protruding pieces 3 and 4 face each other.

In this embodiment, the first and second protruding pieces 3 and 4 are each formed of a magnetic material. Therefore, the first and second protruding pieces 3 and 4 are each a pole piece. The first protruding piece 3 is also hereinafter referred to as a "first pole piece 3a," and the second protruding piece 4 is also hereinafter referred to as a "second pole piece 4a."

The first pole piece 3a is coupled to an iron sheet (not shown) wrapped around the first magnet 1, and the second pole piece 4a is coupled to an iron sheet (not shown) wrapped around the second magnet 2. A strong magnetic field and a great magnetic field gradient (magnetic flux density gradient) can be easily generated using the first and second pole pieces 3a and 4a.

The position adjustment mechanism 5 holds the first magnet 1, and the fixation member 6 holds the second magnet 2. The fixation member 6 may include, for example, a vise for holding the second magnet 2. The position adjustment mechanism 5 and the fixation member 6 are each disposed (fixed) on the fixation base 7. The first magnet 1 and the first pole piece 3a are fixed to the fixation base 7 through the position adjustment mechanism 5, and the second magnet 2 and the second pole piece 4a are fixed to the fixation base 7 through the fixation member 6. In this embodiment, the position adjustment mechanism 5 and the fixation member 6 are disposed so that the first pole piece 3a (first magnet 1) and the second pole piece 4a (second magnet 2) face each other in the y-direction. A space between the first and second magnets 1 and 2 is open to the space external thereto, except for the direction (y-direction) in which the first and second magnets 1 and 2 are aligned.

The position adjustment mechanism 5 adjusts the position of the first pole piece 3a (first magnet 1) in relation to the second pole piece 4a (second magnet 2). Specifically, the position adjustment mechanism 5 adjusts a distance between the first pole piece 3a (first magnet 1) and the second pole piece 4a (second magnet 2). The adjustment of the position of the first pole piece 3a (first magnet 1) by the position adjustment mechanism 5 allows control of the value of the product of the magnetic flux density and the magnetic flux density gradient.

The position adjustment mechanism 5 includes a vise 8 and a movable stage 9. The vise 8 holds the first magnet 1. The vise 8 is fixed to the movable stage 9. The use of the vise 8 can facilitate the adjustment of the position of the first pole piece 3a (first magnet 1) even when a magnetic field having a magnetic flux density of several teslas (T) is being generated.

The vise 8 is preferably a vise with a micrometer. In other words, a jig for holding the first magnet 1 is preferably a small-movement variable-distance jig. The use of a small-movement variable-distance jig as the jig for holding the first magnet 1 facilitates an operation of causing the jig to hold the first magnet 1. Note that the jig for holding the first magnet 1 is not limited to the vise 8. The jig for holding the first magnet 1 is not particularly limited as long as the jig for holding the first magnet 1 can hold the first magnet 1 even when a magnetic field having a magnetic flux density of several teslas (T) is being generated.

The movable stage 9 is a two-axis stage (so-called XY stage), and includes a first stage 9a and a second stage 9b. The vise 8 is fixed to the second stage 9b. The first stage 9a moves in the y-direction. As a result, the second stage 9b (vise 8) moves in the y-direction. In other words, the first magnet 1 and the first pole piece 3a move in the y-direction. The second stage 9b moves in the x-direction. As a result, the vise 8 moves in the x-direction. In other words, the first magnet 1 and the first pole piece 3a move in the x-direction.

The first stage 9a adjusts the distance between the first pole piece 3a (first magnet 1) and the second pole piece 4a (second magnet 2). The second stage 9b adjusts the position in the x-direction of the first pole piece 3a (first magnet 1) in relation to the second pole piece 4a (second magnet 2). By adjusting the position in the x-direction of the first pole piece 3a (first magnet 1), magnetic lines of force suitable for magnetophoresis can be generated. According to this embodiment, the movable stage 9 can be used to generate magnetic lines of force suitable for magnetophoresis. Therefore, magnetic lines of force suitable for magnetophoresis can be easily generated.

The movable stage 9 (first and second stages 9a and 9b) is preferably a microstage (a precision stage or a small-movement stage) with a micrometer. In other words, the first and second stages 9a and 9b preferably move in micrometer-scale increments (with micrometer-scale precision). By the use of a microstage with a micrometer as the movable stage 9, the value of the product of the magnetic flux density and the magnetic flux density gradient can be controlled with higher precision according to an object to be measured. In addition, the magnetic lines of force can be controlled with higher precision.

Figure 2A:
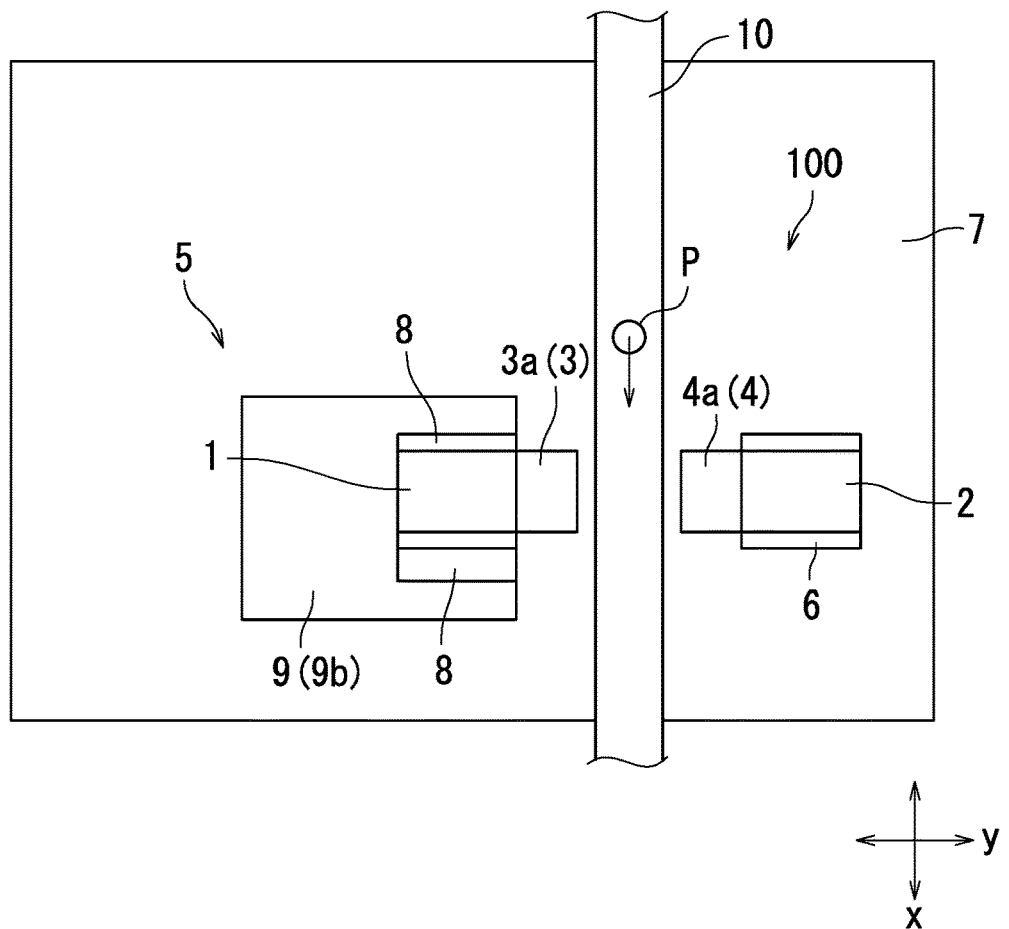
FIG. 2(a) is a plan view of the magnetic field generation device of FIG. 1.
Figure 2B:
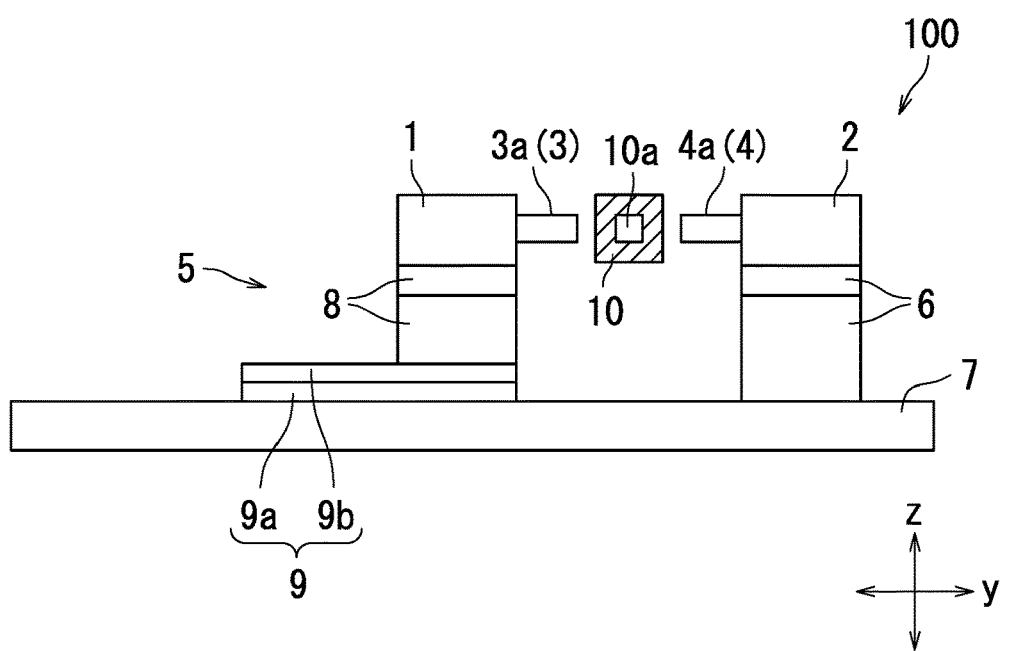
FIG. 2(b) is a front view of the magnetic field generation device of FIG. 1.

FIG. 2(a) is a plan view of the magnetic field generation device 100 of FIG. 1. As shown in FIG. 2(a), a measurement cell 10 is disposed between the first pole piece 3a (first magnet 1) and the second pole piece 4a (second magnet 2). FIG. 2(b) is a front view of the magnetic field generation device 100 of FIG. 1. FIG. 2(b) shows a cross-section of the measurement cell 10. Note that FIGS. 2(a) and 2(b) show a state of the magnetic field generation device 100 during measurement of the volume magnetic susceptibility of a particle p.

The measurement cell 10 has a flow channel 10a. A solution s in which particles p are dispersed in a solvent m is introduced into the flow channel 10a of the measurement cell 10. The magnetic field generation device 100 moves the particles p in a predetermined direction using a magnetic field (magnetic flux density gradient).

In this embodiment, the measurement cell 10 is a tubular member. Specifically, the flow channel 10a of the measurement cell 10 is a capillary. For example, the cross-section of the measurement cell 10 perpendicular to the longitudinal direction (axial direction) thereof is in the shape of a generally square having a side length of about 0.3 mm. The cross-section of the flow channel 10a of the measurement cell 10 perpendicular to the longitudinal direction (axial direction) thereof is in the shape of a generally square having a side length of about 0.1 mm. A material for the measurement cell 10 is, for example, a glass material such as quartz glass, or a resin such as an acrylic resin.

The measurement cell 10 is disposed between the first pole piece 3a (first magnet 1) and the second pole piece 4a (second magnet 2), with the longitudinal axis thereof extending in the x-direction. In other words, the measurement cell 10 is horizontally disposed.

Although not shown, the measurement cell 10 has a flow-in opening and a discharge opening for the solution s. The flow-in opening and the discharge opening are in communication with the flow channel 10a. In the measurement cell 10, the solution s can be introduced into the flow channel 10a through capillary action.

The flow-in opening and discharge opening of the measurement cell 10 are blocked by, for example, an adhesive or Vaseline after the solution s is drawn into the flow channel 10a through capillary action. Specifically, the solution s is introduced into the measurement cell 10, and bubbles are removed from the flow channel 10a, and thereafter, the flow-in opening and discharge opening of the measurement cell 10 are sealed.

The measurement cell 10 is disposed between the first pole piece 3a (first magnet 1) and the second pole piece 4a (second magnet 2) after the solution s reaches an equilibrium state. After the flow-in opening and discharge opening of the measurement cell 10 are sealed, the measurement cell 10 may be agitated or the like so that the particles p are dispersed in the flow channel 10a of the measurement cell 10.

Note that the measurement cell 10 (capillary) may have a curved shape, except for a region where the particle p is observed. The cross-sectional shapes of the measurement cell 10 and the flow channel 10a are not limited to a rectangular shape. For example, the measurement cell 10 and the flow channel 10a may have a circular cross-sectional shape. In addition, the measurement cell 10 is not limited to a tubular member (capillary). The measurement cell 10 may, for example, be a plate-shaped member made of glass in which a flow channel into which the solution s is introduced is formed.

During measurement of the volume magnetic susceptibility of the particle p, the position of the first pole piece 3a (first magnet 1) is adjusted so that the magnetophoretic velocity of the particle p can be detected. Specifically, the distance between the first pole piece 3a (first magnet 1) and the second pole piece 4a (second magnet 2) is adjusted so that the magnetophoretic velocity of the particle p can be detected. The particle p moves in the x-direction due to the generated magnetic field (magnetic flux density gradient in the x-direction).

Figure 3:
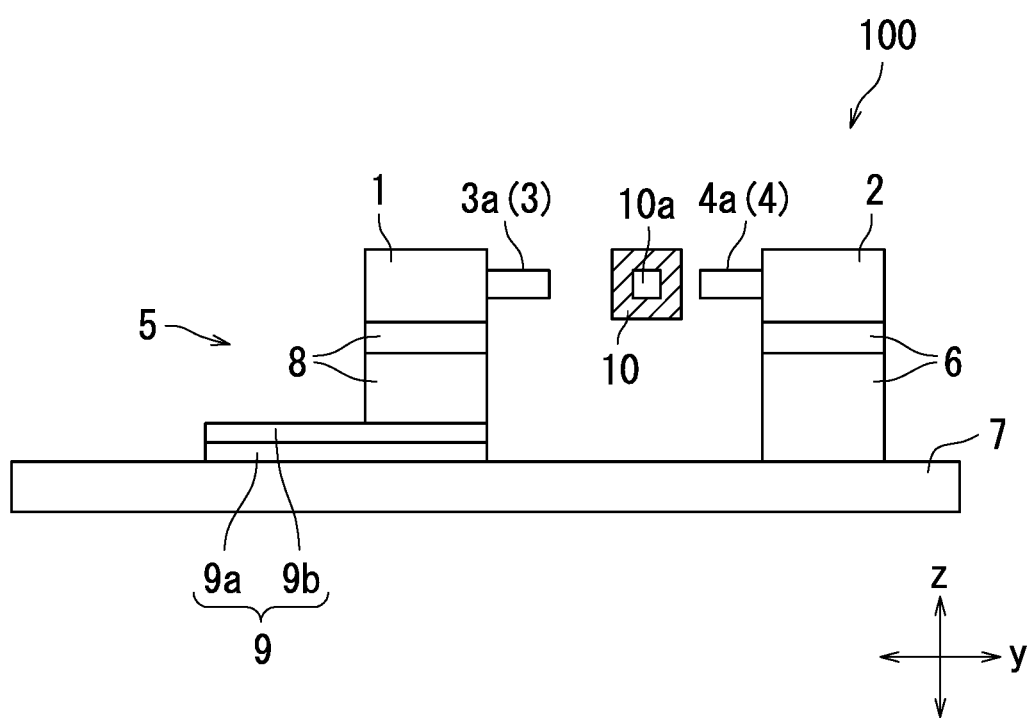
FIG. 3 is a front view showing another state of the magnetic field generation device of FIG. 1.

FIG. 3 is a front view showing another state of the magnetic field generation device 100 of FIG. 1. Specifically, FIG. 3 shows a state of the magnetic field generation device 100 during measurement of the zeta potential of the particle p. As shown in FIG. 3, during measurement of the zeta potential of the particle p, the position adjustment mechanism 5 is used to move the first pole piece 3a (first magnet 1) further away from the second pole piece 4a (second magnet 2). Specifically, the first stage 9a is moved in the y-direction so that the first pole piece 3a (first magnet 1) is located further away from the second pole piece 4a (second magnet 2) such that the particle p is not allowed to undergo magnetophoresis caused by the magnetic field (magnetic flux density gradient).

Figure 4A:
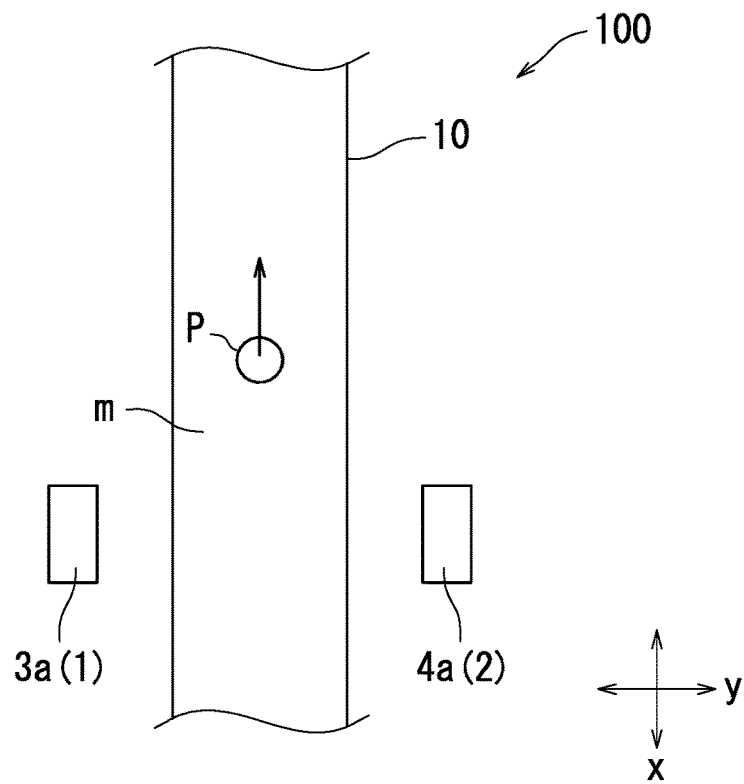
FIGS. 4(a) and 4(b) are diagrams showing a magnetophoretic motion of a particle.
Figure 4B:
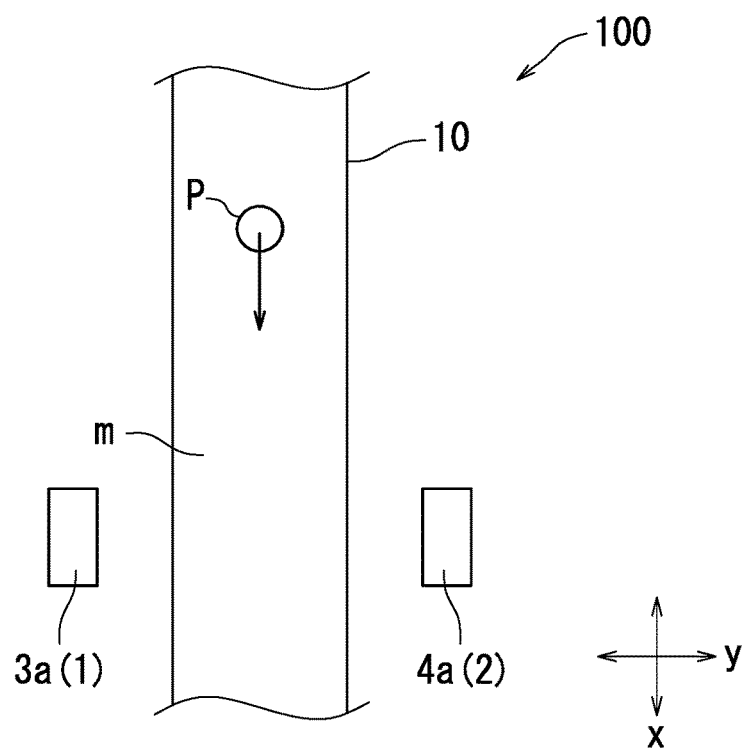

Next, a magnetophoretic motion of the particle p will be described with reference to FIGS. 4(a) and 4(b). FIGS. 4(a) and 4(b) are diagrams showing the magnetophoretic motion of the particle.

As shown in FIG. 4(a), in the case where the volume magnetic susceptibility of the particle p is smaller than the volume magnetic susceptibility of the solvent m, the particle p moves in a direction away from the magnetic field (negative x-direction). Meanwhile, as shown in FIG. 4(b), in the case where the volume magnetic susceptibility of the particle p is greater than the volume magnetic susceptibility of the solvent m, the particle p moves in a direction toward the magnetic field (positive x-direction). The magnetophoretic velocity of the particle p varies depending on the value of the product of the magnetic flux density and the magnetic flux density gradient. Note that the particle p receives a force near an end of the magnet (pole piece). For example, the particle p receives a force in the range of about ±200 µm from the end of the magnet (pole piece).

Figure 5:
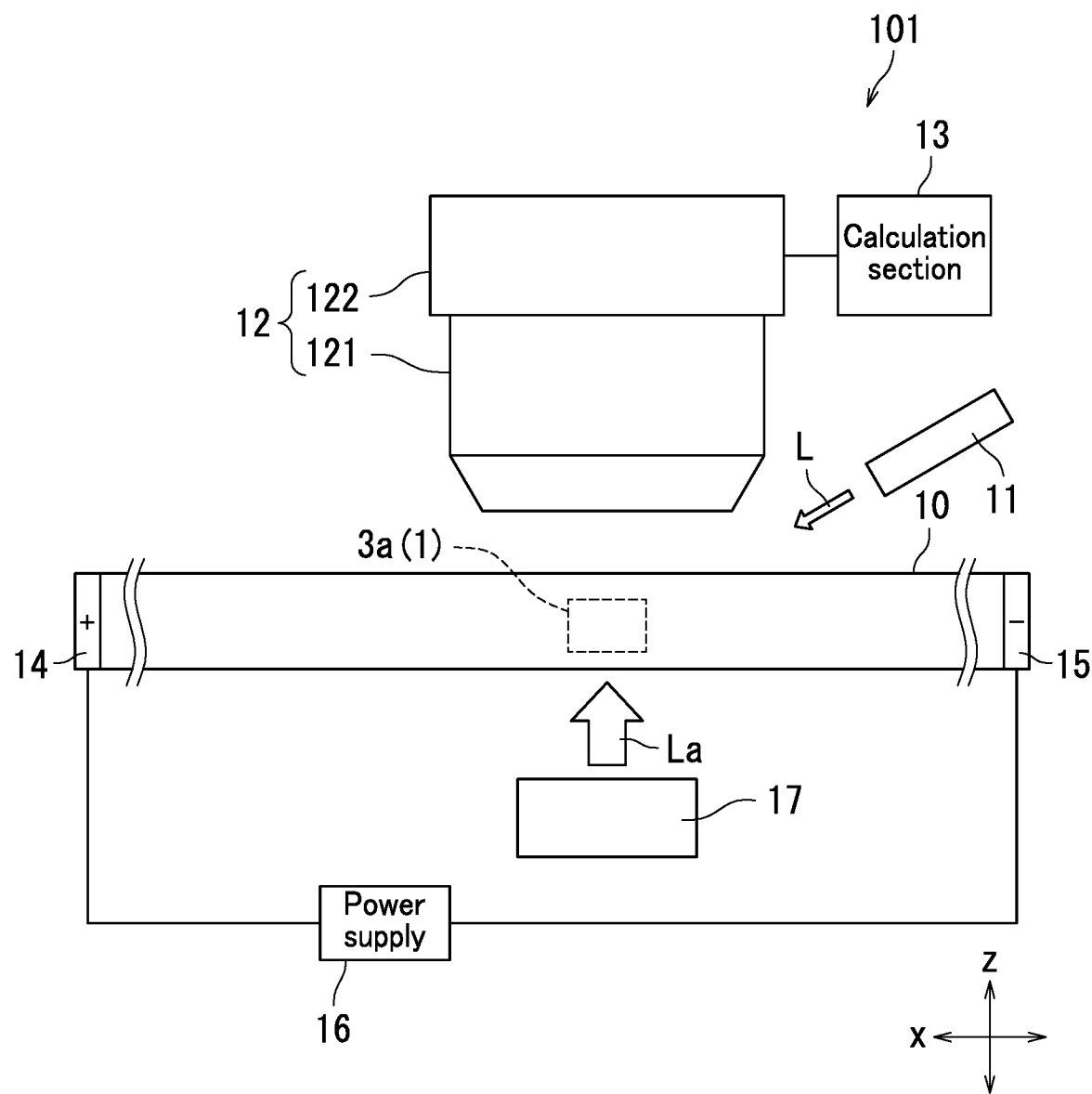
FIG. 5 is a diagram showing a portion of the configuration of an analysis apparatus according to the first embodiment of the present invention.

Next, an analysis apparatus 101 according to the first embodiment will be described with reference to FIG. 5. FIG. 5 is a diagram showing a portion of the configuration of the analysis apparatus 101 of the first embodiment. The analysis apparatus 101 is provided with the magnetic field generation device 100 described above with reference to FIGS. 1-4. The analysis apparatus 101 is further provided with a laser light source 11, a detection section 12, a calculation section 13, a first electrode 14, a second electrode 15, a power supply 16, and a light source 17.

In the analysis apparatus 101, the first electrode 14, the second electrode 15, and the power supply 16 constitute an electric field generation device. The electric field generation device generates an electric field that causes a particle p to be measured (also referred to as a "particle p of interest") to undergo electrophoresis. In addition, the magnetic field generation device 100 and the electric field generation device (the first electrode 14, the second electrode 15, and the power supply 16) constitute a migration section. The migration section causes the particle p of interest to migrate. Specifically, the migration section causes the particle p to undergo magnetophoresis. The migration section also causes the particle p to undergo electrophoresis.

The laser light source 11 emits laser light L during analysis of a particle p having a particle size of not less than 10 nm and less than 1 µm. The laser light L is emitted to the solution s introduced in the measurement cell 10 (the flow channel 10a). As a result, the laser light L is scattered by the particle p contained in the solution s. In other words, scattered light is generated. Note that a portion of the surface of the measurement cell 10 where the laser light L enters is preferably specular-finished. The specular surface finishing can inhibit scattering of laser light caused by the measurement cell 10.

The laser light source 11 emits the laser light L having substantially a uniform wavelength. The laser light L may be either a continuous wave or a pulsed wave. Note that the laser light L may have any wavelength, i.e. the wavelength of the laser light L is not particularly limited. Note that as the wavelength of the laser light L decreases, the degree of scattering of the particle p increases, and therefore, the laser light L preferably has a short wavelength.

The spot of the laser light L covers at least a region where the generated magnetic flux density gradient exists. For example, the spot of the laser light L has a diameter of about several micrometers to about several hundreds of micrometers. Note that the position of the laser light source 11 is not particularly limited as long as the region where the generated magnetic flux density gradient exists can be irradiated with the laser light L. For example, the laser light source 11 may be disposed below the fixation base 7 described above with reference to FIG. 1. In the case where the laser light source 11 is disposed below the fixation base 7, the fixation base 7 has an opening through which the laser light L is passed.

The detection section 12 detects the position of the particle p. Specifically, the detection section 12 detects light scattered by the particle p. The result of detection of the scattered light indicates the position of the particle p. Therefore, by analyzing the detection result of the scattered light, the position of the particle p can be identified. In addition, when the particle p is moving, the motion of the particle p can be detected by the detection section 12 detecting the scattered light at different times. Note that the position of the detection section 12 is not particularly limited as long as the scattered light can be detected. For example, the detection section 12 may be disposed below the fixation base 7 described above with reference to FIG. 1. In the case where the detection section 12 is disposed below the fixation base 7, the fixation base 7 has an opening through which the scattered light is passed, The detection section 12 includes a magnification section 121 and an imaging section 122. For example, the magnification section 121 includes an objective lens. For example, the imaging section 122 includes a charge-coupled device (CCD). Each pixel of the imaging section 122 may be configured using a photodiode or photomultiplier tube. The imaging section 122 captures light scattered by the particle p through the magnification section 121. The position of the particle p can be identified from the result of capturing of the scattered light.

The calculation section 13 measures the magnetophoretic velocity, electrophoretic velocity, volume magnetic susceptibility, and zeta potential of the particle p on the basis of the detection results of the scattered light. For example, employed as the calculation section 13 is a general-purpose computer, such as a personal computer.

The power supply 16 is coupled to the first electrode 14 and the second electrode 15. The power supply 16 generates a direct-current voltage. When the power supply 16 generates a direct-current voltage, the first electrode 14 serves as a positive electrode, and the second electrode 15 serves as a negative electrode. As a result, a uniform electric field is generated in the flow channel 10a of the measurement cell 10.

The power supply 16 generates a direct-current voltage during electrophoresis of the particle p introduced in the flow channel 10a of the measurement cell 10. In other words, the power supply 16 generates a direct-current voltage during measurement of the zeta potential of the particle p. Specifically, as described above with reference to FIG. 3, after the first pole piece 3a (first magnet 1) is moved further away from the second pole piece 4a (second magnet 2) to a position where the particle p is not allowed to undergo magnetophoresis caused by the magnetic field (magnetic flux density gradient), the power supply 16 generates a direct-current voltage.

When the volume magnetic susceptibility of the particle p is measured, the distance between the first pole piece 3a (first magnet 1) and the second pole piece 4a (second magnet 2) is adjusted by the position adjustment mechanism 5 so as to allow measurement of the magnetophoretic velocity of the particle p. The detection section 12 detects the motion of the particle p during magnetophoresis. The calculation section 13 measures the magnetophoretic velocity and volume magnetic susceptibility of the particle p on the basis of the motion of the particle p during magnetophoresis.

Specifically, the calculation section 13 obtains the magnetophoretic velocity of the particle p on the basis of the motion of the particle p whose image has been captured by the imaging section 122. More specifically, the calculation section 13 obtains the magnetophoretic velocity in the x-direction of the particle p on the basis of a change over time in the position in the x-direction of the particle p detected by the imaging section 122. For example, the imaging section 122 may capture an image of the particle p at predetermined time intervals, and based on the result of the image capture, the calculation section 13 may obtain the magnetophoretic velocity of the particle p. Thereafter, the calculation section 13 measures the volume magnetic susceptibility of the particle p on the basis of the magnetophoretic velocity in the x-direction of the particle p.

For example, the calculation section 13 calculates the volume magnetic susceptibility of the particle p according to the following Expression 1:

$$v_x = \{2(\chi_p - \chi_m)r^2/9\eta\mu o\} \times B(dB/dx)$$ [Expression 1]

In Expression 1, $v_x$ represents the magnetophoretic velocity in the x-direction of the particle p, $\chi_p$ represents the volume magnetic susceptibility of the particle p, $\chi_m$ represents the volume magnetic susceptibility of the solvent m, r represents the radius of the particle p, $\eta$ represents the coefficient of viscosity of the solvent m, $\mu o$ represents the magnetic permeability of vacuum, B represents the magnetic flux density, and dB/dx represents the magnetic field gradient (the magnetic flux density gradient in the x-direction). Specifically, dB/dx represents the change rate in the x-direction of the magnetic flux density. Expression 1 is derived from the fact that the difference between magnetic forces exerted on the particle p and the solvent m in the axial direction of the measurement cell 10 (capillary) is substantially equal to a viscous drag.

As described above with reference to FIGS. 4(a) and 4(b), the magnetophoresis direction of the particle p is determined according to a relationship between the magnitude of the volume magnetic susceptibility of the particle p and the magnitude of the volume magnetic susceptibility of the solvent m. In addition, as can be seen from Expression 1 above, the magnetophoretic velocity of the particle p varies depending on the magnetic flux density and the magnetic flux density gradient.

Note that the magnetic flux density gradient varies depending on the distance from the end of the magnet (pole piece). In the case where the volume magnetic susceptibility is calculated using Expression 1 above, the average value of the magnetic flux density gradient in the x-direction is used. In this case, the magnetophoretic velocity indicates the average velocity in the x-direction of the particle p during magnetophoresis.

The radius r of the particle p may be obtained using, for example, a literature value of the particle size of the particle p. Alternatively, the diameter of the particle p may be measured. The diameter of the particle p can be measured using the detection section 12. Specifically, the particle size of the particle p can be directly obtained from the result of capturing an image of the particle p during magnetophoresis. Therefore, the magnetophoretic velocity and particle size of the particle p can be simultaneously obtained from the result of capturing an image of the particle p during magnetophoresis. For example, the calculation section 13 converts an image of the solution s captured by the imaging section 122 into a monochromatic image, and converts the luminance of the monochromatic image into a numerical value. Next, the calculation section 13 compares the derivative of the luminance value with a threshold to set the boundary of the particle p. Thereafter, the calculation section 13 detects the area of the particle p, and obtains a particle size from the radius of the circle that corresponds to that area. Alternatively, a center of the particle p is specified, a plurality of straight lines passing through the center of the particle p are drawn, and the average of the distance of two points where each straight line intersects with the boundary of the particle p is calculated.

When the zeta potential of the particle p is measured, the power supply 16 generates a direct-current voltage after the first pole piece 3a (first magnet 1) is moved further away from the second pole piece 4a (second magnet 2). As a result, an electric field is generated in the flow channel 10a of the measurement cell 10, so that the particle p undergoes electrophoresis. The detection section 12 detects the motion of the particle p during electrophoresis. The calculation section 13 measures the electrophoretic velocity and zeta potential of the particle p on the basis of the motion of the particle p during electrophoresis.

Specifically, likewise the magnetophoretic velocity, the calculation section 13 obtains the electrophoretic velocity in the x-direction of the particle p from the motion in the x-direction of the particle p whose image has been captured by the imaging section 122. Thereafter, the calculation section 13 measures the zeta potential of the particle p from the electrophoretic velocity in the x-direction of the particle p. For example, the calculation section 13 calculates the zeta potential on the basis of the Helmholtz-Smoluchowski equation.

The light source 17 generates light La during analysis of a particle p having a particle size of not less than 1 μm. Specifically, the light source 17 is used in analysis of particles p having a micrometer-scale particle size (not less than 1 μm and less than 1 mm) and a millimeter-scale particle size (not less than 1 mm and less than 1 cm). Note that when the light source 17 emits the light La, the laser light source 11 does not emit the laser light L. Likewise, when the laser light source 11 emits the laser light L, the light source 17 does not emit the light La.

The light La emitted by the light source 17 contains a visible light component and has a relatively high intensity. The light La may have a relatively broad wavelength spectrum. As the light source 17, for example, a halogen lamp is preferably used.

The light source 17 is disposed coaxially with the detection section 12. The region irradiated with the light La by the light source 17 covers at least a region where a magnetic field is generated by the magnetic field generation device 100. The detection section 12 detects the position of the particle p using the light La that has been emitted by the light source 17 and passed through the solution s. Specifically, the imaging section 122 captures the light La that has been emitted by the light source 17 and passed through the solution s, through the magnification section 121. As a result, the position of the particle p is detected.

Note that the position of the light source 17 is not particularly limited as long as the light source 17 and the detection section 12 are coaxial. For example, the light source 17 may be disposed below the fixation base 7 described above with reference to FIG. 1. In the case where the light source 17 is disposed below the fixation base 7, the fixation base 7 has an opening through which the light La is passed.

In the foregoing, the first embodiment has been described. According to the first embodiment, the value of the product of the magnetic flux density and the magnetic flux density gradient can be controlled through the adjustment of the position of the first pole piece 3a (first magnet 1) by the position adjustment mechanism 5. Therefore, the value of the product of the magnetic flux density and the magnetic flux density gradient can be controlled without changing the magnets. As a result, nanometer-scale to millimeter-scale particles p can be analyzed.

Specifically, in the case where the particle p to be measured has a relatively large particle size, the first pole piece 3a (first magnet 1) is positioned further away from the second pole piece 4a so as to decrease the value of the product of the magnetic flux density and the magnetic flux density gradient. Conversely, in the case where the particle p to be measured has a relatively small particle size, the first pole piece 3a (first magnet 1) is positioned closer to the second pole piece 4a so as to increase the value of the product of the magnetic flux density and the magnetic flux density gradient.

In addition, in the case where the distance between the two magnets is fixed by a magnet-to-magnet distance fixation jig, the arrangement of parts around the magnets is static, and therefore, it is difficult to design the optical system. In contrast to this, according to the first embodiment, the space between the first and second magnets 1 and 2 is open to the space external thereto, except for the y-direction. As a result, the constraints on the arrangement of the laser light source 11, the detection section 12, and the light source 17 are reduced, and therefore, it is easier to design the optical system. Furthermore, the reduction of the constraints on the arrangement of the laser light source 11, the detection section 12, and the light source 17 leads to a reduction in the constraints on the shape of the measurement cell and the shape of the flow channel formed in the measurement cell.

In addition, according to the first embodiment, the distance between the first pole piece 3a (first magnet 1) and the second pole piece 4a (second magnet 2) can be increased so as not to allow the particle p to undergo magnetophoresis. Therefore, the motion of the particle p during electrophoresis can be detected in the same region where the motion of the particle p during magnetophoresis is detected. Therefore, during measurement of the zeta potential, the particle p can be observed at the same position where the volume magnetic susceptibility is measured. In other words, magnetophoresis and electrophoresis can be observed at the same position.

Although it has been indicated in the first embodiment that the position adjustment mechanism 5 includes a two-axis stage, the position adjustment mechanism 5 may include a single-axis stage that moves only in the y-direction.

In addition, although in the first embodiment, the vise 8 is fixed to the movable stage 9, a vise may hold a movable stage.

In addition, although in the first embodiment, the magnetic field generation device 100 is provided with the first protruding piece 3 (first pole piece 3a) and the second protruding piece 4 (second pole piece 4a), the first protruding piece 3 (first pole piece 3a) and the second protruding piece 4 (second pole piece 4a) may be removed.

In addition, although in the first embodiment, the measurement cell 10 is disposed extending in the x-direction, the measurement cell 10 may be disposed extending in a direction other than the x-direction. For example, the measurement cell 10 may be disposed extending in the z-direction. In other words, the measurement cell 10 may be vertically disposed. Alternatively, the measurement cell 10 may be disposed extending in a direction obliquely intersecting with a plane perpendicular to the z-direction.

In addition, although it has been indicated that in the first embodiment that the migration velocity (the magnetophoretic velocity and the electrophoretic velocity) and particle size of the particle p are simultaneously obtained, the particle size of the particle p may be obtained without causing the particle p to migrate (without subjecting the particle P to magnetophoresis or electrophoresis).

In addition, it has been indicated in the first embodiment that the particle size of the particle p is obtained by analyzing an image. Alternatively, in the case where the particle size is relatively large, the light source 17 may emit the light La, an image of the particle p may be displayed, and the particle size may be obtained from the displayed image of the particle p. Alternatively, the particle size of the particle p may be measured by dynamic light scattering. Specifically, a particle p having a particle size of not more than 3 μm undergoes Brownian motion. Therefore, in the case where the particle size is not more than 3 μm, the particle size of the particle p can be obtained by obtaining fluctuation of scattered light that occurs when the particle p is irradiated with the laser light L of the laser light source 11 without causing the particle P to migrate (without subjecting the particle P to magnetophoresis or electrophoresis). Specifically, the particle size of the particle p can be obtained from the result of fluctuation analysis of the scattered light.

In addition, in the first embodiment, the laser light L of the laser light source 11 is used during analysis of a particle p having a relatively small particle size, and the light La of the light source 17 is used during analysis of a particle p having a relatively large particle size. In the case where the particle p is a fluorescent particle, the particle p can be analyzed without using the laser light L. Specifically, the particle p can be analyzed using only the light La of the light source 17.

In addition, although it has been indicated in the first embodiment that the analysis apparatus 101 is configured to measure the volume magnetic susceptibility and zeta potential of the particle p, the analysis apparatus 101 may be configured not to measure the zeta potential of the particle p. In other words, the analysis apparatus 101 may not include the first electrode 14, the second electrode 15, or the power supply 16.

Second Embodiment

Next, another embodiment (second embodiment) of the magnetic field generation device and analysis apparatus of the present invention will be described with reference to FIGS. 1-6. The second embodiment is different from the first embodiment in which the volume magnetic susceptibility and zeta potential of the particle p are obtained with the solution s flowing in the measurement cell 10 (the flow channel 10a).

Figure 6:
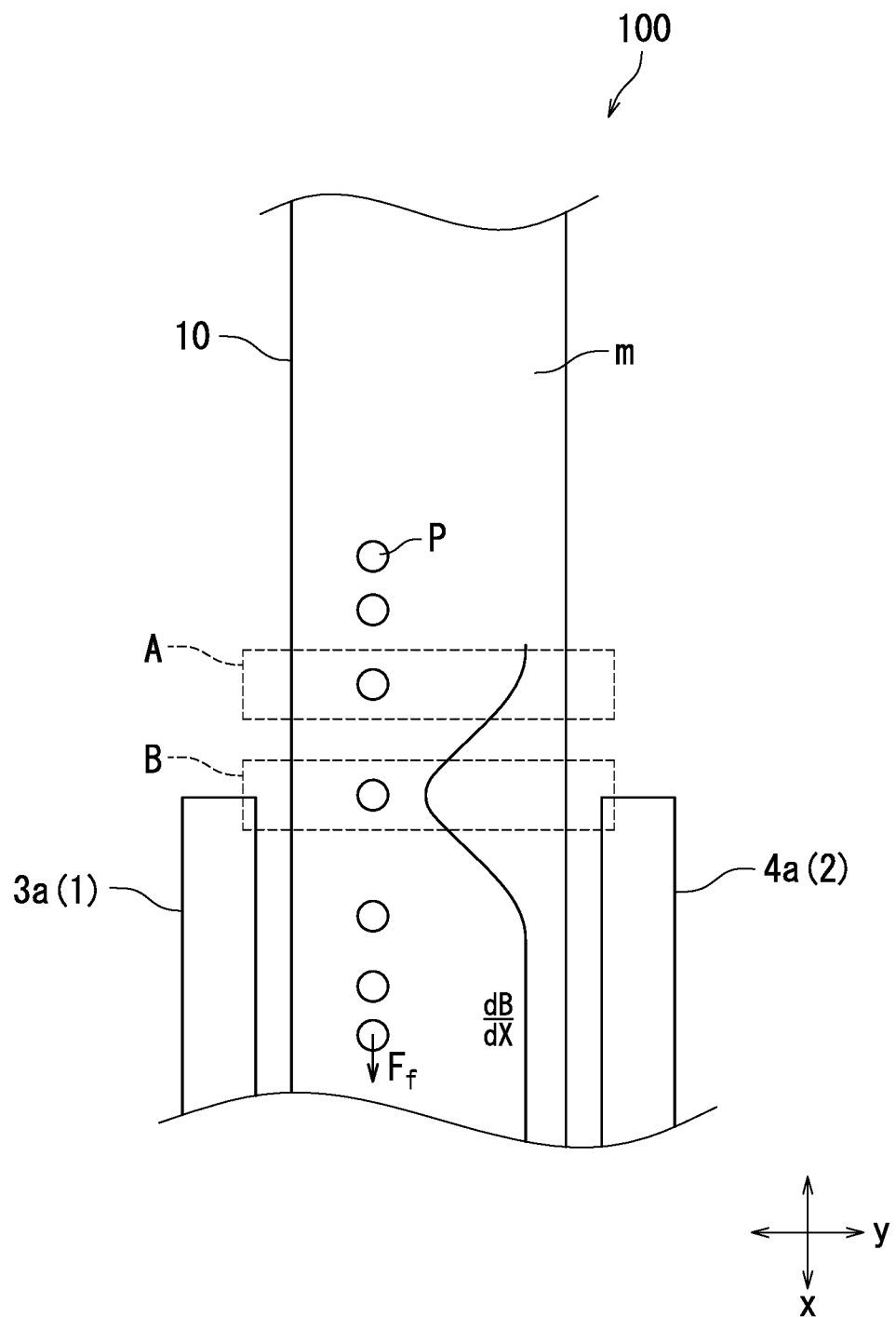
FIG. 6 is a plan view showing a portion of a magnetic field generation device according to a second embodiment of the present invention.

FIG. 6 is a plan view showing a portion of a magnetic field generation device 100 according to the second embodiment. FIG. 6 shows a motion of a particle p flowing in a measurement cell 10 (flow channel 10a). Specifically, FIG. 6 shows changes over time in the position of a particle p moving over time. In this embodiment, a pump is coupled to the flow-in opening of the measurement cell 10, and a solution s is driven by the pump to flow in the measurement cell 10 (flow channel 10a). Preferably, the pump is coupled to the flow-in opening of the measurement cell 10 through a valve.

In a region where a magnetic flux density gradient does not exist, the particle p is driven by a fluid driving force $F_f$ exerted thereon by the solvent m to flow in the measurement cell 10 (flow channel 10a) in the x-direction. Meanwhile, in a region where a generated magnetic flux density gradient exists, the particle p is driven by the fluid driving force $F_f$ exerted thereon by the solvent m and a magnetic force derived from the magnetic flux density gradient in the x-direction, to flow in the measurement cell 10 (flow channel 10a) in the x-direction.

FIG. 6 shows a distribution of the gradient dB/dx in the x-direction of the magnetic flux density for the sake of description. As shown in FIG. 6, the gradient dB/dx in the x-direction of the magnetic flux density varies depending on the distance from the end of the pole piece (first and second pole pieces 3a and 4a). As a result, the magnetophoretic velocity varies depending on the position in the x-direction according to the distribution of the gradient dB/dx in the x-direction of the magnetic flux density. Therefore, the movement velocity in the x-direction of the particle p, passing through a region A, is different from the movement velocity in the x-direction of the particle p, passing through a region B.

A calculation section 13 included in the analysis apparatus 101 of this embodiment measures the movement velocity of the particle p at two points. For example, the calculation section 13 measures the movement velocity of the particle p in the regions A and B of FIG. 6. Specifically, the calculation section 13 obtains a first movement velocity from the motion in the x-direction of the particle p, passing through the region A. The calculation section 13 also obtains a second movement velocity from the motion in the x-direction of the particle p, passing through the region B. Both of the regions A and B are included in the region where the generated magnetic flux density gradient exists. The first and second movement velocities each indicate the movement velocity in the x-direction of the particle p.

After obtaining the first and second movement velocities, the calculation section 13 calculates the volume magnetic susceptibility of the particle p according to the following Expression 2:

$$\Delta v_x = \{2(\chi_p - \chi_m)r^2/9\eta\pi o\} \times \Delta B(dB/dx) \quad \text{[Expression 2]}$$

In Expression 2, $\Delta v_x$ represents the velocity difference between the magnetophoretic velocity in the x-direction of the particle p, passing through the region A, and the magnetophoretic velocity in the x-direction of the particle p, passing through the region B. In addition, $\Delta B(dB/dx)$ represents the difference between the value of the product of the magnetic flux density and the magnetic flux density gradient in the x-direction in the region A and the value of the product of the magnetic flux density and the magnetic flux density gradient in the x-direction in the region B.

$\Delta v_x$ can be obtained by calculating the difference between the first movement velocity and the second movement velocity. Specifically, by calculating the difference between the first movement velocity and the second movement velocity, a velocity component in the x-direction derived from the fluid driving force $F_f$ exerted on the solvent m is cancelled, and therefore, the velocity difference between the magnetophoretic velocity in the x-direction of the particle p, passing through the region A, and the magnetophoretic velocity in the x-direction of the particle p, passing through the region B, can be obtained.

Note that also for obtaining the zeta potential of the particle p, the value of the difference between the movement velocity (first movement velocity) of the particle p, passing through the region A, and the movement velocity (second movement velocity) of the particle p, passing through the region B, is calculated. By calculating the difference between the first and second movement velocities, the electrophoretic velocity can be obtained.

In the foregoing, the second embodiment has been described. According to the second embodiment, the volume magnetic susceptibility and zeta potential of a particle p flowing in the flow channel 10a can be obtained. In addition, in the case where the solution s (particle p) is introduced into the capillary through capillary action, both ends of the capillary are sealed after the solution s is introduced into the capillary. However, when the solution s is introduced into the capillary, bubbles may be formed in the capillary, and bubbles may remain in the capillary. When there are bubbles in the capillary, the motion of the particle p may become irregular during magnetophoresis due to the difference between the volume magnetic susceptibility of the solvent m and the volume magnetic susceptibility of the bubble (gas). The irregular motion of the particle p makes it difficult to accurately obtain the volume magnetic susceptibility. In contrast to this, in the second embodiment, the solution s flows in the flow channel 10a, and therefore, there is not a bubble in the flow channel 10a. Therefore, the measurement precision of the volume magnetic susceptibility is improved.

Third Embodiment

Next, another embodiment (third embodiment) of the magnetic field generation device and analysis apparatus of the present invention will be described with reference to FIG. 7. The third embodiment is different from the second embodiment in that the siphon principle is used to introduce the solution s into the flow channel 10a of the measurement cell 10.

Figure 7:
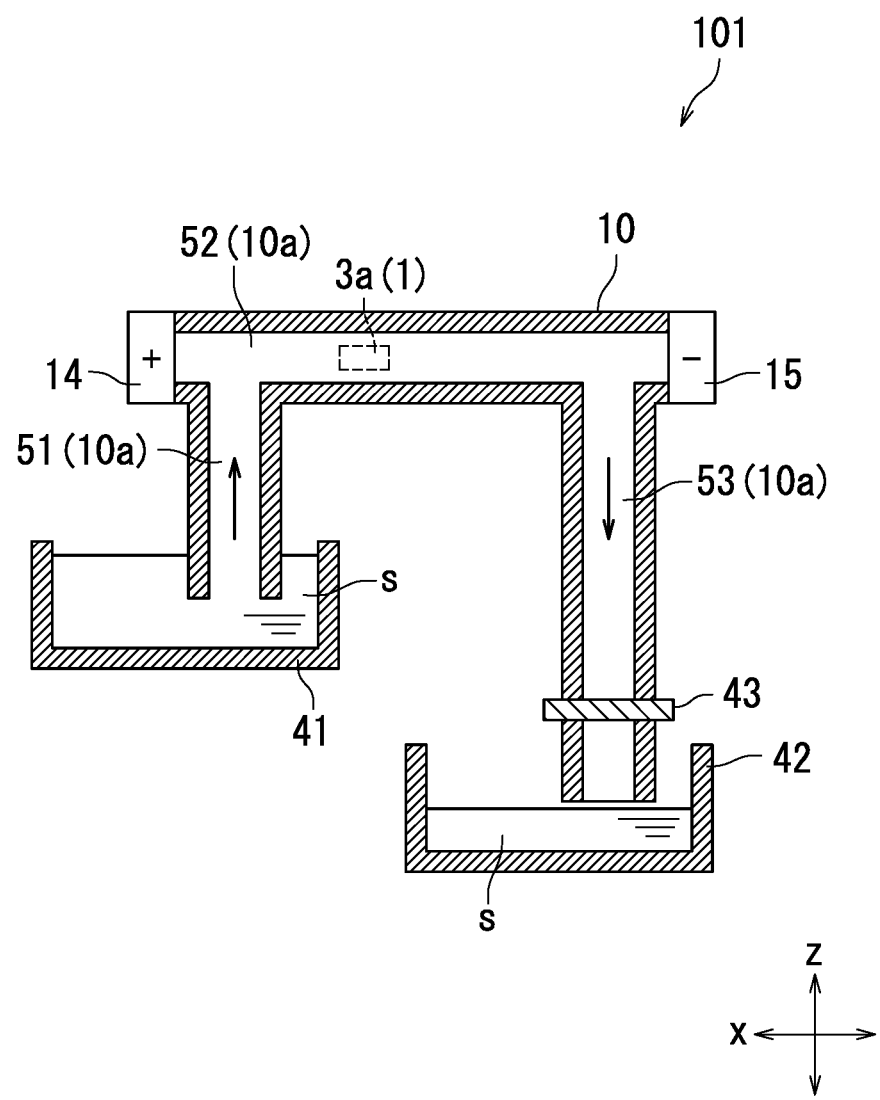
FIG. 7 is a cross-sectional view showing a portion of the configuration of an analysis apparatus according to a third embodiment of the present invention.

FIG. 7 is a cross-sectional view showing a portion of an analysis apparatus 101 according to the third embodiment.

As shown in FIG. 7, the analysis apparatus 101 of the third embodiment is provided with a supply section 41, a recovery section 42, and a valve 43. In addition, a flow channel 10a of a measurement cell 10 includes an introduction section 51, a body section 52, and a flow-out section 53.

The introduction section 51, the body section 52, and the flow-out section 53 are linked together in this order. Specifically, the introduction section 51 is linked to one of the ends in the longitudinal direction of the body section 52, and the flow-out section 53 is linked to the other end in the longitudinal direction of the body section 52. The introduction section 51 and the flow-out section 53 extend downward, and the flow-out section 53 is longer than the introduction section 51. In other words, the exit of the flow-out section 53 is positioned below the entrance of the introduction section 51.

The supply section 41 is positioned under the introduction section 51, and the recovery section 42 is positioned under the flow-out section 53. The valve 43 is provided in the flow-out section 53. The valve 43 is also positioned below the entrance of the introduction section 51.

The solution s (particle p) is caused to flow into the body section 52 of the measurement cell 10 as follows: the solution s is supplied to the supply section 41 with the valve 43 closed; and thereafter, the valve 43 is opened, so that the solution s flows from the supply section 41 to the measurement cell 10 according to the siphon principle. After flowing into the measurement cell 10, the solution s flows through the introduction section 51, the body section 52, and the flow-out section 53 in this order, and thereafter, is recovered by the recovery section 42. As a result, a particle p contained in the solution s flows through the introduction section 51, the body section 52, and the flow-out section 53 in this order.

In the foregoing, the third embodiment has been described. According to the third embodiment, as in the second embodiment, the volume magnetic susceptibility and zeta potential of a particle p flowing in the flow channel 10a can be obtained. In addition, the precision of measurement of the volume magnetic susceptibility can be improved.

Fourth Embodiment

Next, another embodiment (fourth embodiment) of the magnetic field generation device and analysis apparatus of the present invention will be described with reference to FIGS. 8-10. The fourth embodiment is different from the first embodiment in that the specific gravity of a particle p is measured simultaneously with the volume magnetic susceptibility of the particle p.

Figure 8:
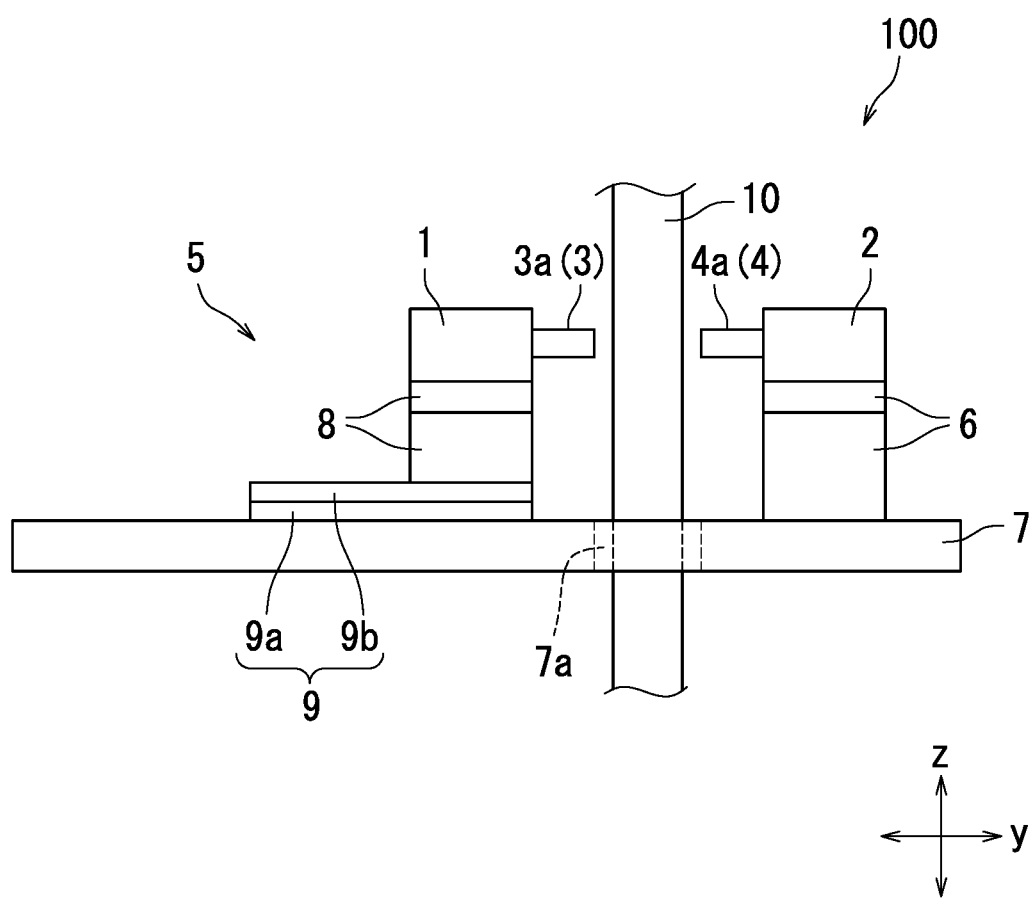
FIG. 8 is a front view of a magnetic field generation device according to a fourth embodiment of the present invention.

FIG. 8 is a front view of a magnetic field generation device 100 according to the fourth embodiment. As shown in FIG. 8, a measurement cell 10 is disposed extending in the z-direction. In other words, the measurement cell 10 is disposed extending in a vertical direction. In the fourth embodiment, the fixation base 7 has an opening 7a through which the measurement cell penetrates. In the case where the specific gravity of a particle p is greater than the specific gravity of the solvent m, a force derived from the gravitational field is exerted on the particle p in the measurement cell 10 vertically disposed, so that the particle p settles (gravitational fall) in the z-direction with a velocity depending on the specific gravity.

Figure 9:
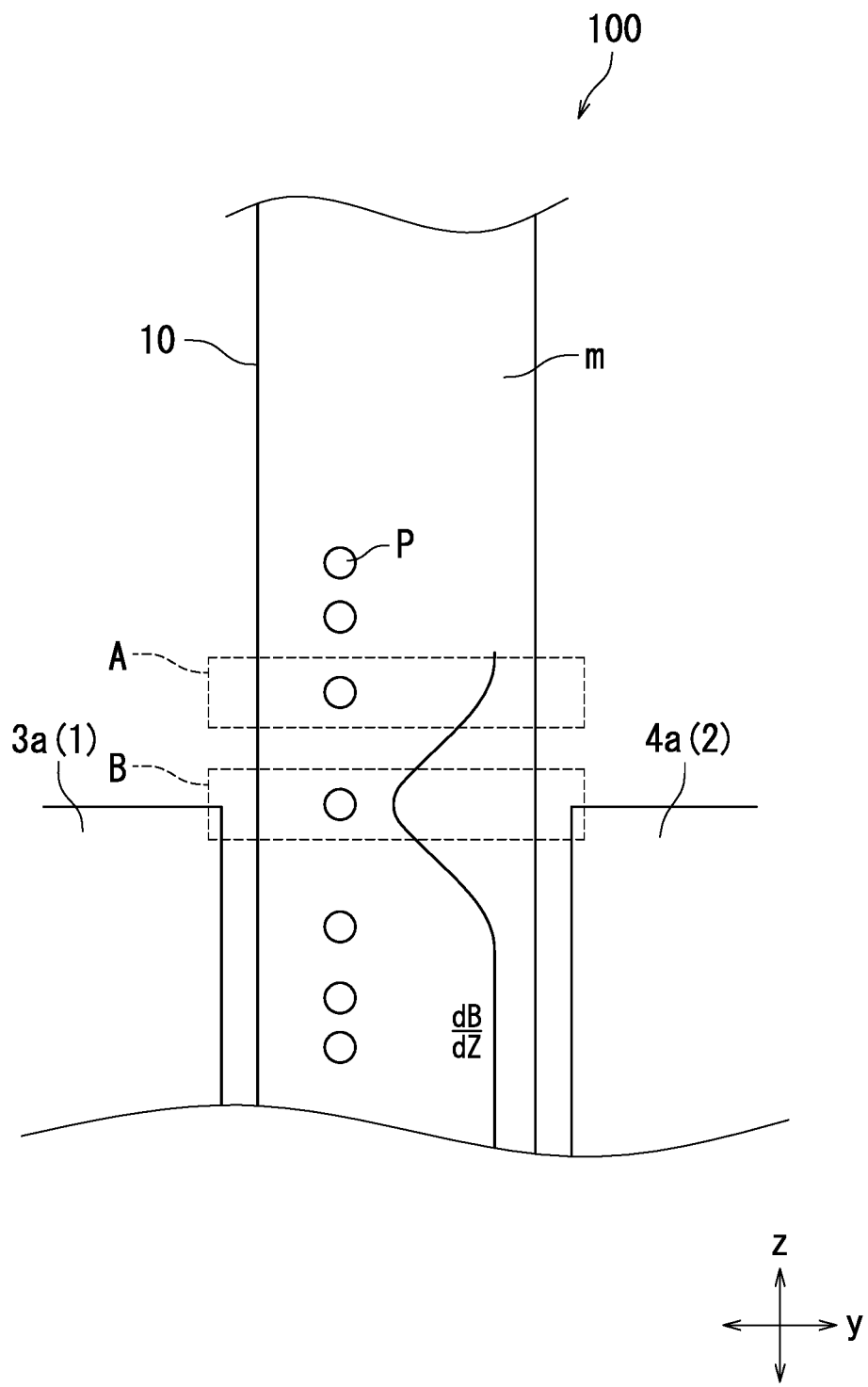
FIG. 9 is a front view showing a portion of the magnetic field generation device of the fourth embodiment of the present invention.

FIG. 9 is a front view showing a portion of the magnetic field generation device 100 of the fourth embodiment. FIG. 9 shows a motion of a particle p flowing in the measurement cell 10 (flow channel 10a). Specifically, FIG. 9 shows changes over time in the position of the moving particle p.

In this embodiment, in the region where the generated magnetic flux density gradient exists, the particle p receives a magnetic force derived from the magnetic flux density gradient in the z-direction in addition to the force derived from the gravitational field, and moves in the z-direction. Therefore, in the region where the generated magnetic flux density gradient exists, the movement velocity in the z-direction of the particle p is the addition of the gravitational settling velocity (gravitational fall velocity) and the magnetophoretic velocity.

FIG. 9 shows a distribution of the gradient dB/dz in the z-direction of the magnetic flux density for the sake of description. dB/dz represents the change rate in the z-direction of the magnetic flux density. As shown in FIG. 9, the gradient dB/dz in the z-direction of the magnetic flux density varies depending on the distance from the end of the pole piece (the first and second pole pieces 3a and 4a). As a result, the magnetophoretic velocity varies depending on the position in the z-direction according to the distribution of the gradient dB/dz in the z-direction of the magnetic flux density. Therefore, the movement velocity in the z-direction of the particle p, passing through a region A, is different from the movement velocity in the z-direction of the particle p, passing through a region B.

Figure 10:
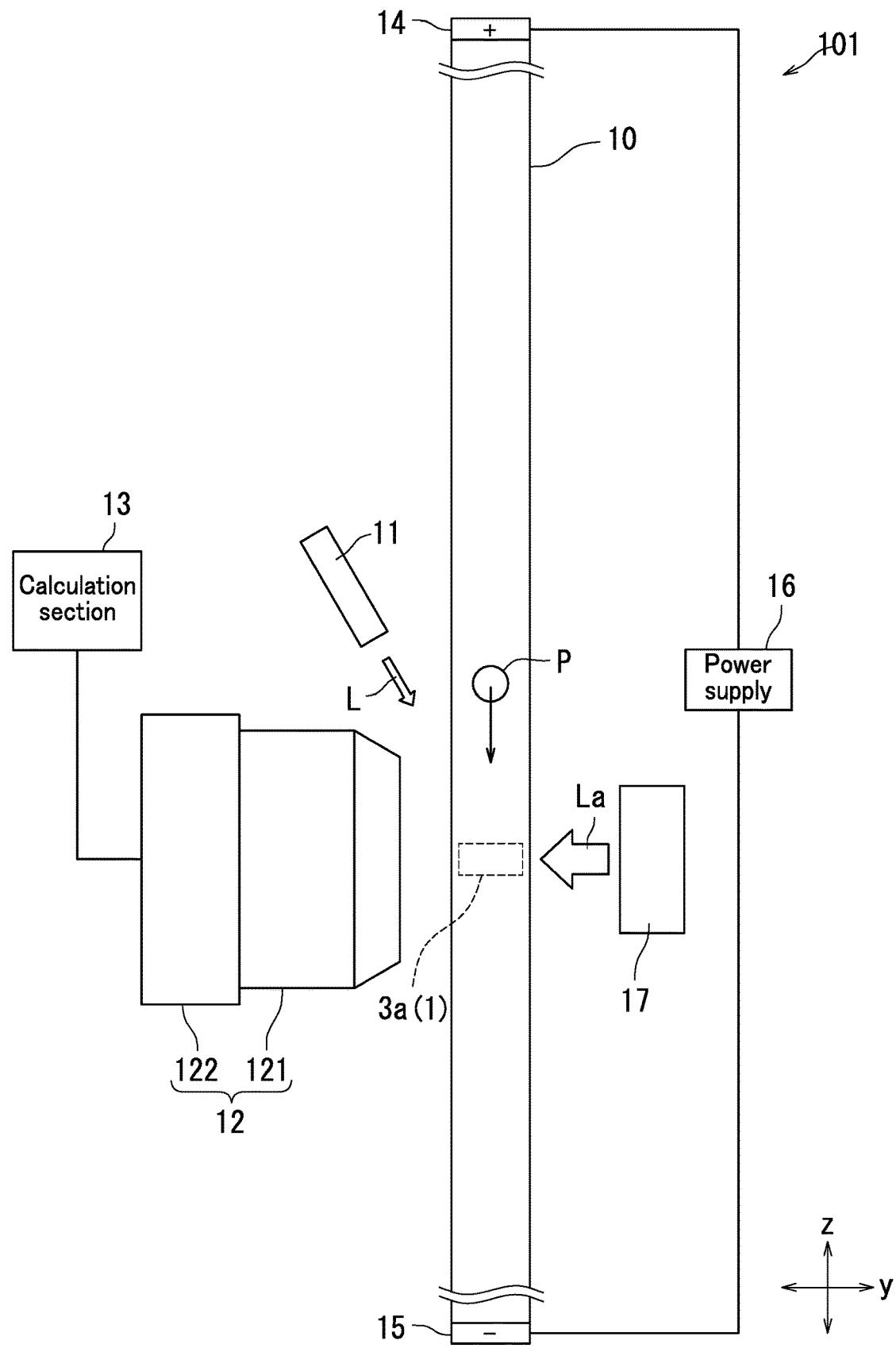
FIG. 10 is a diagram showing a portion of the configuration of an analysis apparatus according to the fourth embodiment of the present invention.

FIG. 10 is a diagram showing a portion of the configuration of an analysis apparatus 101 according to the fourth embodiment. A calculation section 13 measures the movement velocity of the particle p at two points. For example, the calculation section 13 measures the movement velocity of the particle p in the regions A and B of FIG. 9. Specifically, the calculation section 13 obtains a first movement velocity from the motion in the z-direction of the particle p, passing through the region A. The calculation section 13 also obtains a second movement velocity from the motion in the z-direction of the particle p, passing through the region B. Both of the regions A and B are included in the region where the generated magnetic flux density gradient exists. The first and second movement velocities each indicate the movement velocity in the z-direction of the particle p.

After obtaining the first and second movement velocities, the calculation section 13 calculates the volume magnetic susceptibility of the particle p according to the following Expression 3:

$$\Delta v_z = \{2(\chi_p - \chi_m)r^2/9\eta\pi o\} \times \Delta B(dB/dx) \qquad \text{[Expression 3]}$$

In Expression 3, $\Delta v_z$ represents the velocity difference between the magnetophoretic velocity in the z-direction of the particle p, passing through the region A, and the magnetophoretic velocity in the z-direction of the particle p, passing through the region B. In addition, $\Delta B(dB/dz)$ represents the difference between the value of the product of the magnetic flux density and the magnetic flux density gradient in the z-direction in the region A and the value of the product of the magnetic flux density and the magnetic flux density gradient in the z-direction in the region B.

$\Delta v_z$ can be obtained by calculating the difference between the first movement velocity and the second movement velocity. Specifically, by calculating the difference between the first movement velocity and the second movement velocity, a velocity component in the x-direction derived from the gravitational field is cancelled, and therefore, the velocity difference between the magnetophoretic velocity in the z-direction of the particle p, passing through the region A, and the magnetophoretic velocity in the z-direction of the particle p, passing through the region B, can be obtained.

After obtaining the volume magnetic susceptibility of the particle p, the calculation section 13 calculates the magnetophoretic velocity in the z-direction of the particle p, passing through the region A, according to, for example, the following Expression 4:

$$v_z = \{2(\chi_p - \chi_m)r^2 / 9\eta\pi o\} \times \Delta B(dB/dx) \quad \text{[Expression 4]}$$

In Expression 4, $v_z$ represents the magnetophoretic velocity in the z-direction of the particle p, passing through the region A. In addition, B(dB/dz) represents the product of the magnetic flux density and the magnetic flux density gradient in the z-direction in the region A. Furthermore, the calculation section 13 calculates the value of the difference between the magnetophoretic velocity in the z-direction of the particle p, passing through the region A, and the first movement velocity. This value indicates the gravitational settling velocity (gravitational fall velocity). The calculation section 13 measures the specific gravity of the particle p from the gravitational settling velocity.

Note that also for obtaining the zeta potential of the particle p, the value of the difference between the movement velocity (first movement velocity) of the particle p, passing through the region A, and the movement velocity (second movement velocity) of the particle p, passing through the region B, is calculated. By calculating the difference between the first and second movement velocities, the electrophoretic velocity can be obtained.

In the foregoing, the fourth embodiment has been described. According to the fourth embodiment, the volume magnetic susceptibility and specific gravity of the particle p can be simultaneously obtained.

Note that the calculation section 13 may measure the mass of the particle p. Specifically, the calculation section 13 calculates the volume of the particle p using the particle size of the particle p. Thereafter, the calculation section 13 calculates the mass of the particle p using the specific gravity and volume of the particle p. In the case where the volume of the particle p is previously set in the calculation section 13, the calculation section 13 calculates the mass of the particle p using the previously set volume of the particle p.

In addition, in the fourth embodiment, in order to obtain the specific gravity or mass of the particle p, the calculation section 13 obtains the magnetophoretic velocity in the z-direction of the particle p, passing through the region A. Alternatively, the calculation section 13 may obtain the magnetophoretic velocity in the z-direction of the particle p, passing through the region B.

Fifth Embodiment

Next, another embodiment (fifth embodiment) of the magnetic field generation device and analysis apparatus of the present invention will be described with reference to FIGS. 11 and 12. The fifth embodiment is different from the second embodiment in that the migration section of the analysis apparatus 101 includes two magnetic field generation devices 100. Specifically, although in the second embodiment, the value of the difference between movement velocities at two points is obtained in a region where a magnetic flux density gradient generated by a pair of pole pieces (a pair of magnets) exists, in the fifth embodiment the two magnetic field generation devices 100 are used to obtain the value of the difference between movement velocities at two points.

Figure 11:
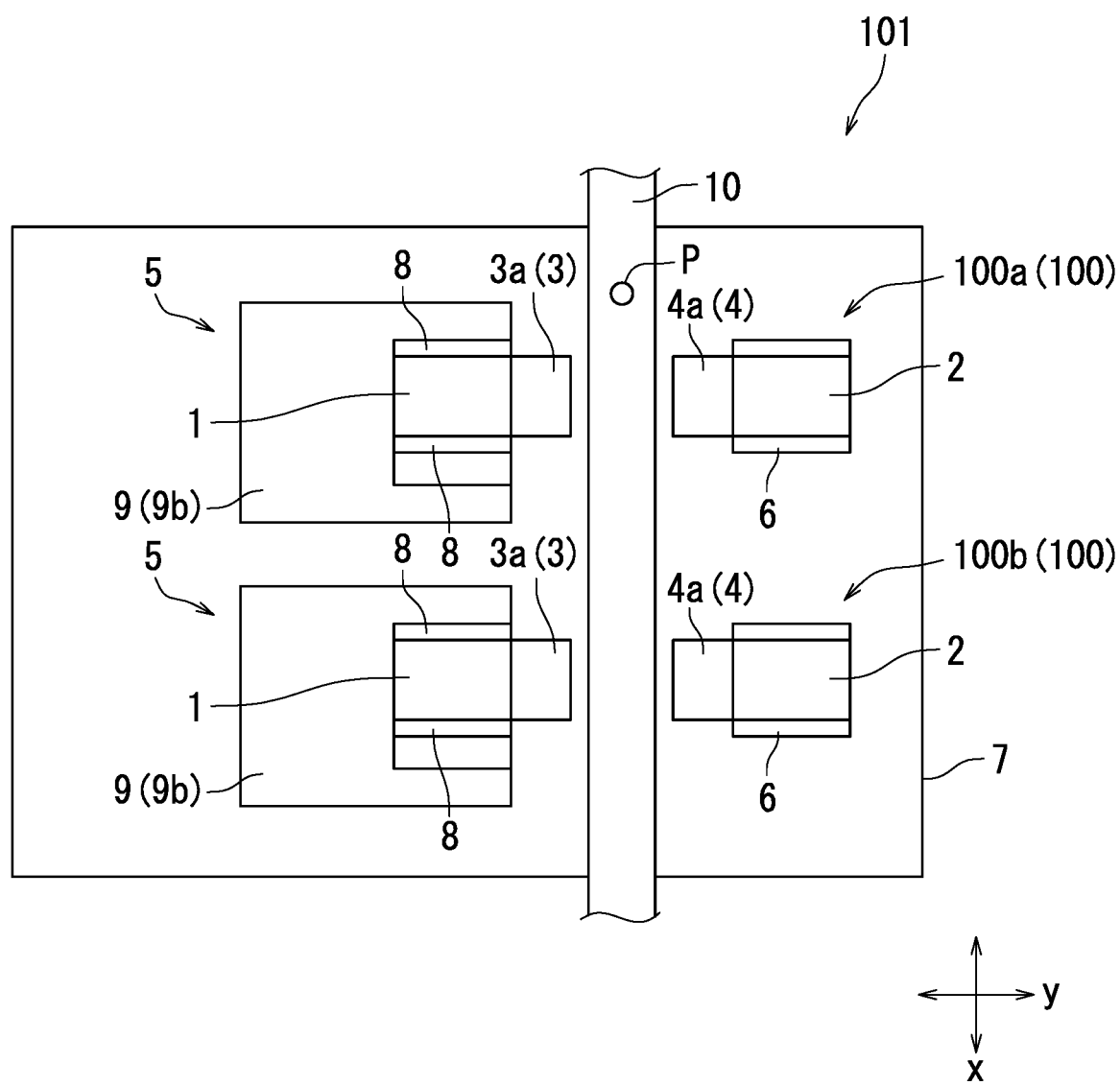
FIG. 11 is a plan view showing two magnetic field generation devices included in an analysis apparatus according to a fifth embodiment of the present invention.

FIG. 11 is a plan view showing two magnetic field generation devices 100 (a first magnetic field generation device 100a and a second magnetic field generation device 100b) included in an analysis apparatus 101 according to the fifth embodiment. As shown in FIG. 11, the first and second magnetic field generation devices 100a and 100b are spaced apart from each other in the x-direction.

A measurement cell 10 is disposed so that a particle p flows between a first pole piece 3a (first magnet 1) and a second pole piece 4a (second magnet 2) included in the first magnetic field generation device 100a, and between a first pole piece 3a (first magnet 1) and a second pole piece 4a (second magnet 2) included in the second magnetic field generation device 100b. In this embodiment, a pump is coupled to the flow-in opening of the measurement cell 10, and a solution s is driven by the pump to flow in the measurement cell 10 (flow channel 10a).

The first and second magnetic field generation devices 100a and 100b generate magnetic fields having different intensities (magnetic flux densities). As a result, there is a difference $\Delta B(dB/dx)$ in the value of the product of a magnetic flux density and a magnetic flux density gradient in the x-direction between the first and second magnetic field generation devices 100a and 100b. The region where a magnetic flux density gradient generated by the first magnetic field generation device 100a exists is also hereinafter referred to as a "first region," and the region where a magnetic flux density gradient generated by the second magnetic field generation device 100b exists is also referred to as a "second region."

The difference in the value of the product of the magnetic flux density and the magnetic flux density gradient in the x-direction between the first region and the second region, leads to the difference between the movement velocity (migration velocity) in the x-direction of the particle p, passing through the first region, and the movement velocity (migration velocity) in the x-direction of the particle p, passing through the second region.

Figure 12:
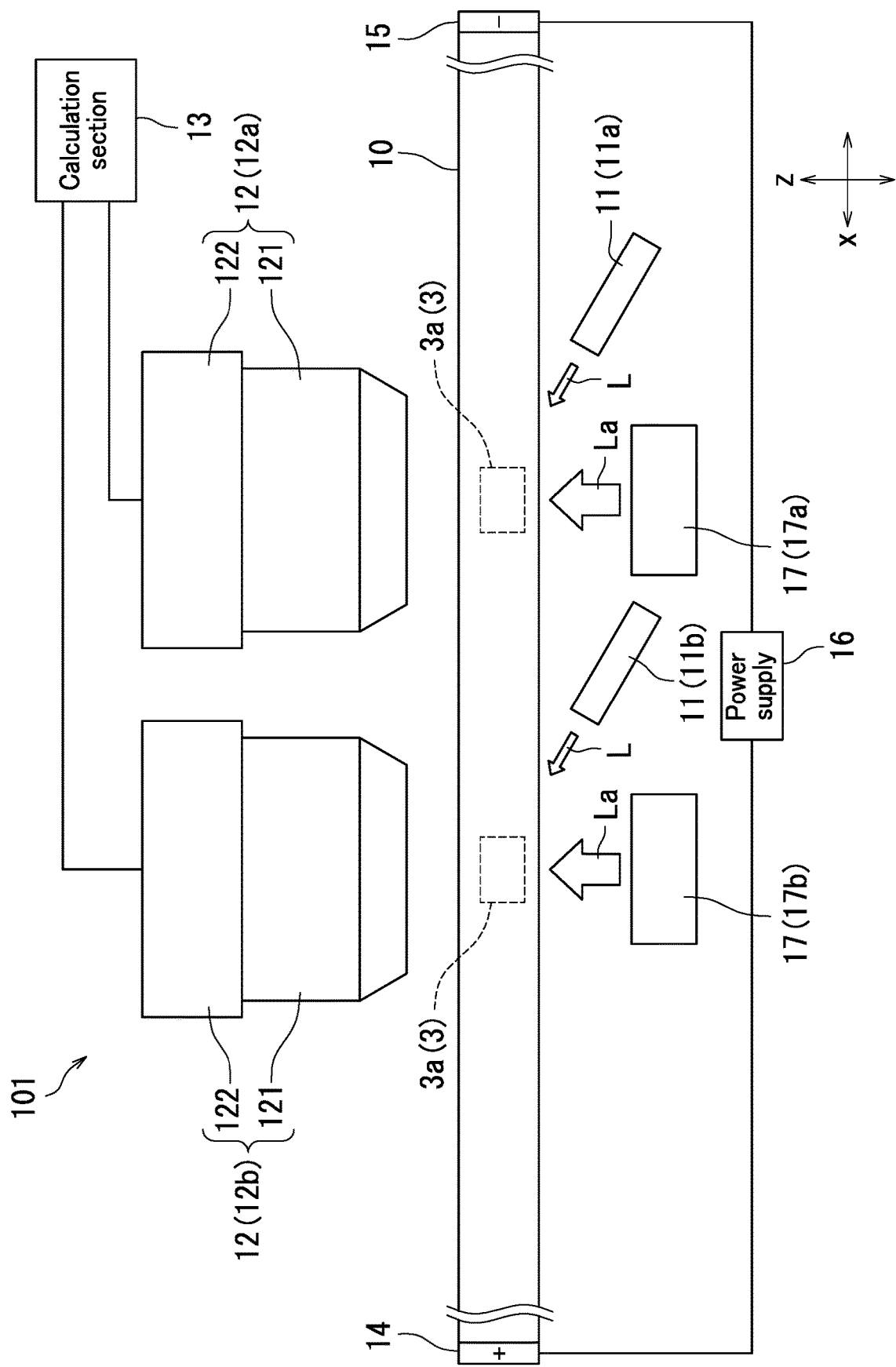
FIG. 12 is a diagram showing a portion of the configuration of the analysis apparatus of the fifth embodiment of the present invention.

FIG. 12 is a diagram showing a portion of the configuration of an analysis apparatus 101 according to the fifth embodiment. The analysis apparatus 101 of the fifth embodiment is provided with two laser light sources 11 (a first laser light source 11a and a second laser light source 11b), two detection sections 12 (a first detection section 12a and a second detection section 12b), and two light sources 17 (a first light source 17a and a second light source 17b). The first laser light source 11a, the first detection section 12a, and the first light source 17a are disposed as in the first magnetic field generation device 100a described above with reference to FIG. 11. The second laser light source 11b, the second detection section 12b, and the second light source 17b are disposed as in the second magnetic field generation device 100b described above with reference to FIG. 11.

The calculation section 13 obtains a first movement velocity from the motion in the x-direction of the particle p, passing through the region (first region) where a magnetic flux density gradient generated by the first magnetic field generation device 100a exists. The calculation section 13 also obtains a second movement velocity from the motion in the x-direction of the particle p, passing through the region (second region) where a magnetic flux density gradient generated by the second magnetic field generation device 100b exists.

After obtaining the first and second movement velocities, the calculation section 13 calculates the volume magnetic susceptibility of the particle p according to Expression 2, described above in the second embodiment. In the fifth embodiment, $\Delta v_x$ represents the velocity difference between the magnetophoretic velocity in the x-direction of the particle p, passing through the first region, and the magnetophoretic velocity in the x-direction of the particle p, passing through the second region. In addition, $\Delta B(dB/dx)$ represents the difference between the value (average value) of the product of the magnetic flux density and the magnetic flux density gradient in the x-direction in the first region, and the value (average value) of the product of density and the magnetic flux density gradient in the x-direction in the second region.

Note that also for obtaining the zeta potential of the particle p, the value of the difference between the movement velocity (first movement velocity) of the particle p, passing through the first region, and the movement velocity (second movement velocity) of the particle p, passing through the second region, is calculated. By calculating the difference between the first and second movement velocities, the electrophoretic velocity can be obtained.

In the foregoing, the fifth embodiment has been described. According to the fifth embodiment, as in the second embodiment, the volume magnetic susceptibility and zeta potential of a particle p flowing in the flow channel 10a can be obtained. In addition, in the fifth embodiment, the volume magnetic susceptibility of a particle p flowing in the flow channel 10a can be obtained without measuring a distribution of the magnetic flux density gradient.

Although in the fifth embodiment, the solution s is driven by a pump to flow, the solution s may be caused to flow in the measurement cell 10 (the flow channel 10a) using the siphon principle as described in the third embodiment.

Sixth Embodiment

Next, another embodiment (sixth embodiment) of the magnetic field generation device and analysis apparatus of the present invention will be described with reference to FIGS. 13 and 14. The sixth embodiment is different from the fourth embodiment in that the migration section of the analysis apparatus 101 includes two magnetic field generation devices 100. Specifically, although in the fourth embodiment, the value of the difference between movement velocities at two points is obtained in a region where a magnetic flux density gradient generated by a pair of pole pieces (a pair of magnets) exists, in the sixth embodiment the two magnetic field generation devices 100 are used to obtain the value of the difference between movement velocities at two points.

Figure 13:
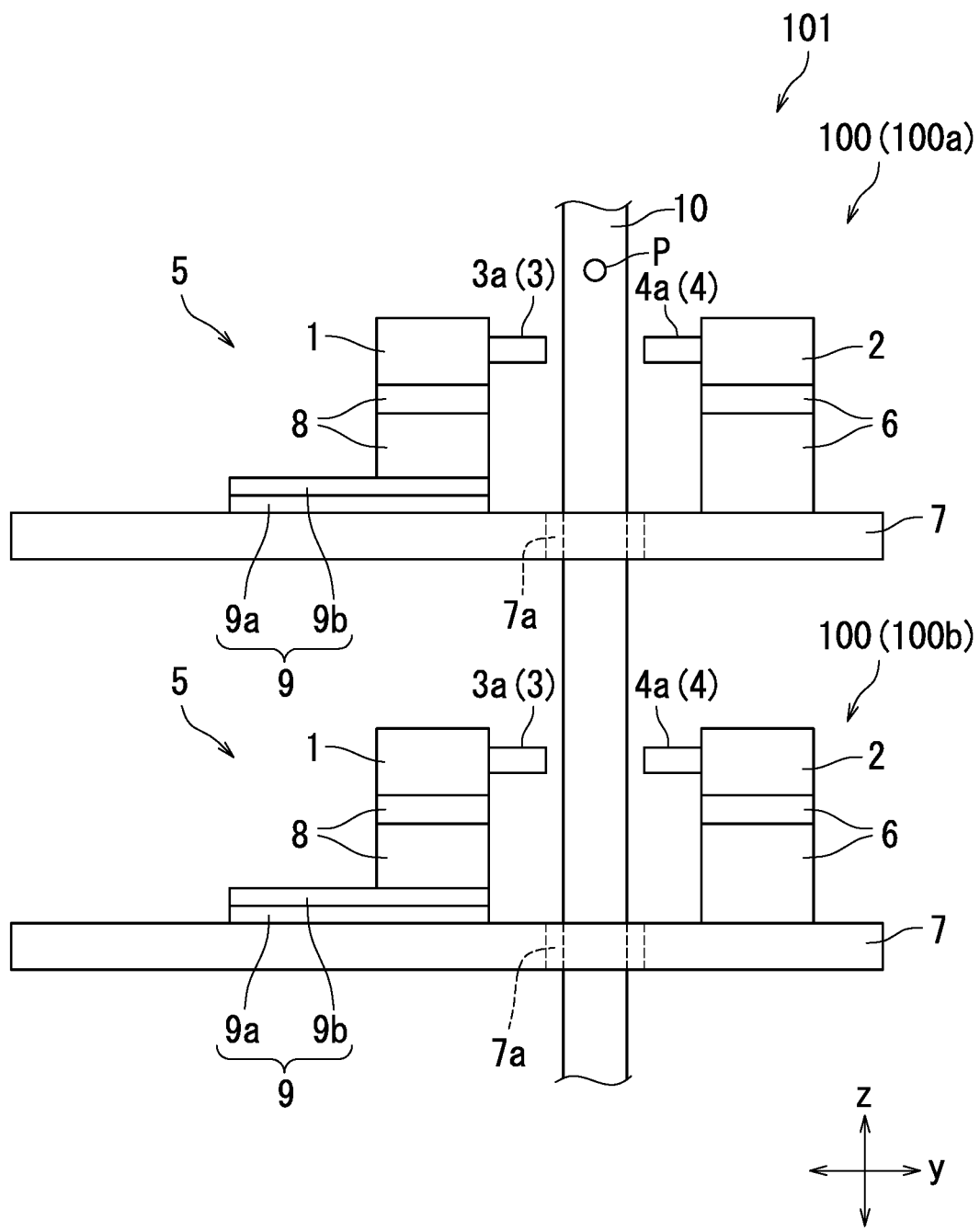
FIG. 13 is a front view showing two magnetic field generation devices included in an analysis apparatus according to a sixth embodiment of the present invention.

FIG. 13 is a front view showing two magnetic field generation devices 100 (a first magnetic field generation device 100a and a second magnetic field generation device 100b) included in an analysis apparatus 101 according to the sixth embodiment. As shown in FIG. 13, the first and second magnetic field generation devices 100a and 100b are spaced apart from each other in the z-direction.

The measurement cell 10 is disposed so that a particle p flows between a first pole piece 3a (first magnet 1) and a second pole piece 4a (second magnet 2) included in the first magnetic field generation device 100a, and between a first pole piece 3a (first magnet 1) and a second pole piece 4a (second magnet 2) included in the second magnetic field generation device 100b. In this embodiment, in a region where a magnetic flux density gradient exists, the particle p receives a magnetic force derived from the magnetic flux density gradient in the z-direction in addition to a force derived from the gravitational field, and moves in the z-direction. Therefore, in the region where the generated magnetic flux density gradient exists, the movement velocity in the z-direction of the particle p is the addition of the gravitational settling velocity (gravitational fall velocity) and the magnetophoretic velocity.

The first and second magnetic field generation devices 100a and 100b generate magnetic fields having different intensities (magnetic flux densities). As a result, there is a difference $\Delta B(dB/dz)$ in the value of the product of the magnetic flux density and the magnetic flux density gradient in the z-direction between the first and second magnetic field generation devices 100a and 100b. As in the fifth embodiment, the region where a magnetic flux density gradient generated by the first magnetic field generation device 100a exists is also hereinafter referred to as a "first region," and the region where a magnetic flux density gradient generated by the second magnetic field generation device 100b exists is also referred to as a "second region."

The difference in the value of the product of the magnetic flux density and the magnetic flux density gradient in the z-direction between the first region and the second region, leads to the difference between the movement velocity (migration velocity) in the z-direction of the particle p, passing through the first region, and the movement velocity (migration velocity) in the z-direction of the particle p, passing through the second region.

Figure 14:
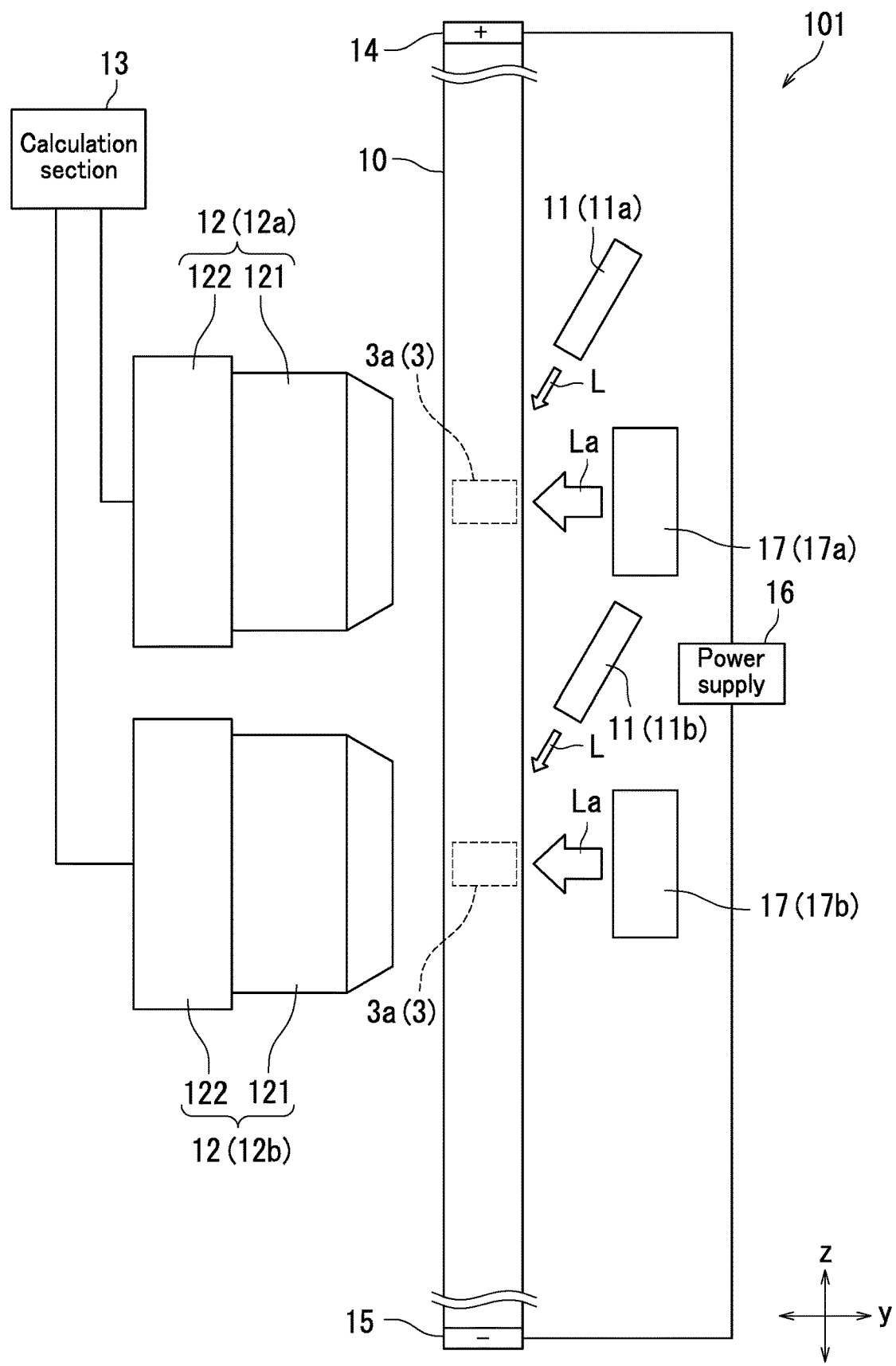
FIG. 14 is a diagram showing a portion of the configuration of the analysis apparatus of the sixth embodiment of the present invention.

FIG. 14 is a diagram showing a portion of the configuration of the analysis apparatus 101 of the sixth embodiment. The analysis apparatus 101 of the sixth embodiment is provided with two laser light sources 11 (a first laser light source 11a and a second laser light source 11b), two detection sections 12 (a first detection section 12a and a second detection section 12b), and two light sources 17 (a first light source 17a and a second light source 17b). The first laser light source 11a, the first detection section 12a, and the first light source 17a are disposed as in the first magnetic field generation device 100a described above with reference to FIG. 13. The second laser light source 11b, the second detection section 12b, and the second light source 17b are disposed as in the second magnetic field generation device 100b described above with reference to FIG. 13.

The calculation section 13 obtains a first movement velocity from the motion in the z-direction of the particle p, passing through the region (first region) where a magnetic flux density gradient generated by the first magnetic field generation device 100a exists. The calculation section 13 also obtains a second movement velocity from the motion in the z-direction of the particle p, passing through the region (second region) where a magnetic flux density gradient generated by the second magnetic field generation device 100b exists.

After obtaining the first and second movement velocities, the calculation section 13 calculates the volume magnetic susceptibility of the particle p according to Expression 3, described above in the fourth embodiment. In the sixth embodiment, $\Delta v_z$ represents the velocity difference between the magnetophoretic velocity in the z-direction of the particle p, passing through the first region, and the magnetophoretic velocity in the z-direction of the particle p, passing through the second region. In addition, $\Delta B(dB/dz)$ represents the difference between the value (average value) of the product of the magnetic flux density and the magnetic flux density gradient in the z-direction in the first region, and the value (average value) of the product of the magnetic flux density and the magnetic flux density gradient in the z-direction in the second region.

Furthermore, after obtaining the volume magnetic susceptibility of the particle p, the calculation section 13 calculates the magnetophoretic velocity in the z-direction of the particle p, passing through the first region, according to Expression 4, described above in the fourth embodiment. In the sixth embodiment, $v_z$ represents the magnetophoretic velocity (average velocity) in the z-direction of the particle p, passing through the first region. In addition, B(dB/dz) represents the product of the magnetic flux density and the magnetic flux density gradient in the z-direction in the first region.

The calculation section 13 calculates the value of the difference between the magnetophoretic velocity in the z-direction of the particle p, passing through the first region, and the first movement velocity. This value indicates the gravitational settling velocity (gravitational fall velocity). The calculation section 13 measures the specific gravity of the particle p from the gravitational settling velocity.

Note that also for obtaining the zeta potential of the particle p, the value of the difference between the movement velocity (first movement velocity) of the particle p, passing through the first region, and the movement velocity (second movement velocity) of the particle p, passing through the second region, is calculated. By calculating the difference between the first and second movement velocities, the electrophoretic velocity can be obtained.

In the foregoing, the sixth embodiment has been described. According to the sixth embodiment, as in the fourth embodiment, the volume magnetic susceptibility and specific gravity of the particle p can be simultaneously obtained. In addition, according to the sixth embodiment, the volume magnetic susceptibility of a particle p flowing in the flow channel 10a can be obtained without measuring a distribution of the magnetic flux density gradient.

Note that as described in the fourth embodiment, the calculation section 13 may calculate the mass of the particle p. In addition, in the sixth embodiment, in order to obtain the specific gravity or mass of the particle p, the calculation section 13 obtains the magnetophoretic velocity in the z-direction of the particle p, passing through the first region. Alternatively, the calculation section 13 may obtain the magnetophoretic velocity in the z-direction of the particle p, passing through the second region.

Seventh Embodiment

Figure 15A:
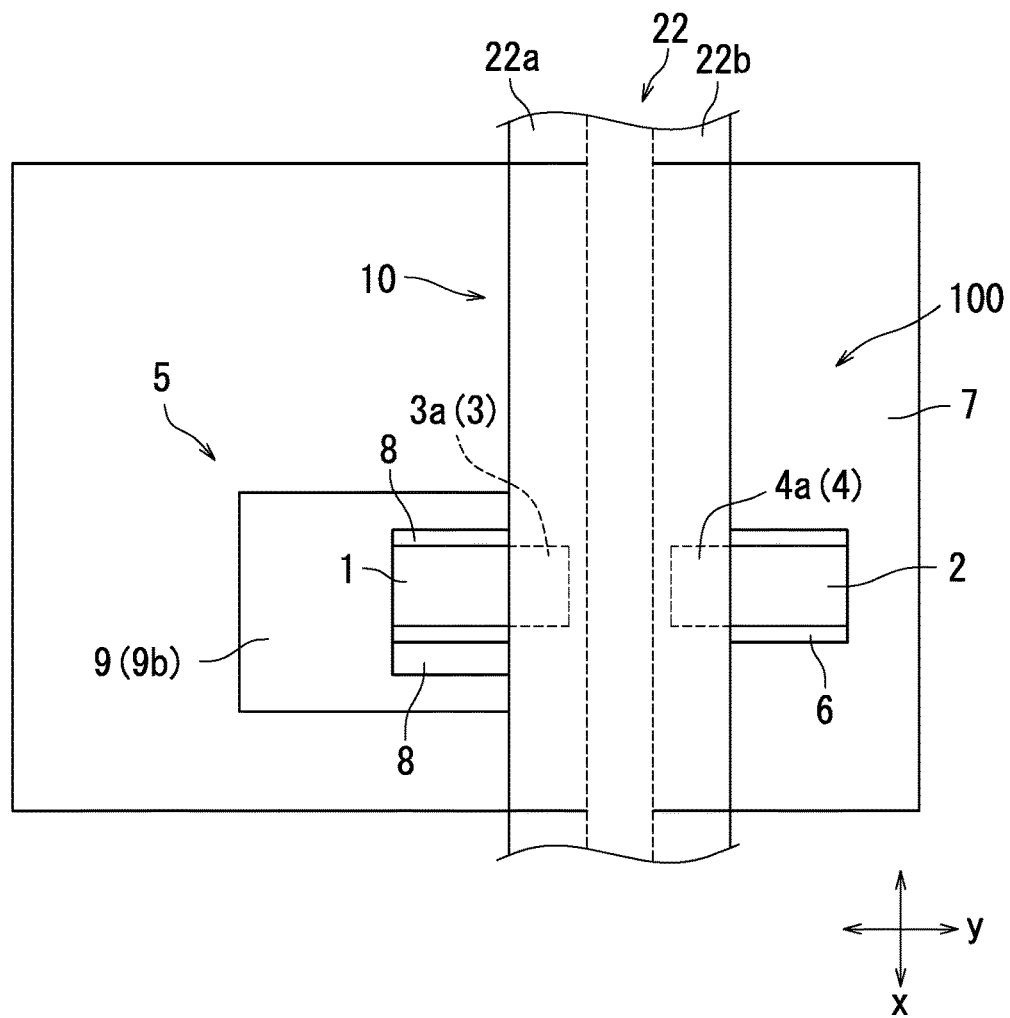
FIG. 15(a) is a plan view showing a measurement cell according to a seventh embodiment of the present invention.
Figure 15B:
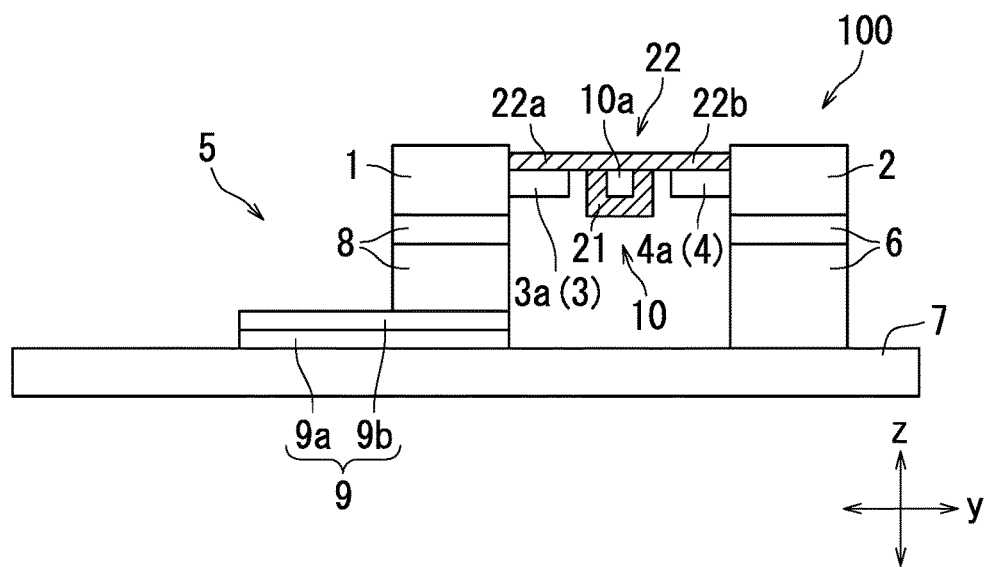
FIG. 15(b) is a cross-sectional view showing the measurement cell of the seventh embodiment of the present invention.

Next, an embodiment (seventh embodiment) of the measurement cell of the present invention will be described with reference to FIGS. 15(a) and 15(b). FIG. 15(a) is a plan view showing a measurement cell 10 according to the seventh embodiment. FIG. 15(b) is a cross-sectional view showing the measurement cell 10 of the seventh embodiment. Specifically, FIGS. 15(a) and 15(b) show the measurement cell 10 provided in a magnetic field generation device 100. FIG. 15(b) is a front view of the magnetic field generation device 100. Note that FIGS. 15(a) and 15(b) show a state of the magnetic field generation device 100 during measurement of the volume magnetic susceptibility of a particle p. The magnetic field generation device 100 of the seventh embodiment has the same configuration as that of the magnetic field generation device 100 described above in the first embodiment.

As shown in FIGS. 15(a) and 15(b), the measurement cell 10 has a longitudinal axis, and a T-shaped cross-section thereof perpendicular to the longitudinal direction (axial direction). Specifically, the measurement cell 10 includes a body portion 21 and a top plate portion 22. The body portion 21 has a flow channel 10a extending in the longitudinal direction. The flow channel 10a formed in the body portion 21 is open upward. In other words, the flow channel 10a formed in the body portion 21 is a groove. The flow channel 10a may be formed by, for example, cutting. The top plate portion 22 is tightly attached to an upper surface of a side wall portion of the body portion 21 by, for example, an adhesive. As a result, the flow channel 10a is covered by the top plate portion 22 from above, so that the flow channel 10a becomes a capillary. Therefore, a solution s can be introduced into the flow channel 10a through capillary action.

The top plate portion 22 includes a first joint portion 22a and a second joint portion 22b. The first joint portion 22a protrudes from the body portion 21 in one of opposite directions perpendicular to the longitudinal direction of the measurement cell 10. The second joint portion 22b protrudes from the body portion 21 in the other of the opposite directions perpendicular to the longitudinal direction of the measurement cell 10. In this embodiment, the first joint portion 22a protrudes in the negative y-direction, and the second joint portion 22b protrudes in the positive y-direction.

The measurement cell 10 is horizontally disposed. Specifically, the measurement cell 10 is disposed extending in the x-direction so that the body portion 21 is positioned between the first pole piece 3a and the second pole piece 4a. More specifically, the measurement cell 10 is disposed so that the first joint portion 22a is joined to the first pole piece 3a, and the second joint portion 22b is joined to the second pole piece 4a. As a result, the first joint portion 22a is supported by the first pole piece 3a, and the second joint portion 22b is supported by the second pole piece 4a. In other words, the measurement cell 10 is supported by the first and second pole pieces 3a and 4a.

A material for the body portion 21 and the top plate portion 22 is, for example, a glass material such as quartz glass or a resin such as an acrylic resin. In the case where a glass material is selected as a material for the top plate portion 22, the top plate portion 22 may, for example, be a glass plate. Note that the laser light source 11 described above with reference to FIG. 5 is preferably disposed so that the laser light L enters the flow channel 10a of the body portion 21 through the top plate portion 22. In the case where the laser light L enters the flow channel 10a through the top plate portion 22, scattering of the laser light L by the measurement cell 10 can be inhibited if the opposite surface of the top plate portion 22 from the body portion 21 is specular-finished. Therefore, the specular surface finishing work is facilitated.

The amounts of protrusion of the first and second joint portions 22a and 22b are not particularly limited as long as the movement in the positive y-direction of the first pole piece 3a is not blocked and the measurement cell 10 does not fall. Specifically, the first pole piece 3a is positioned closest to the second pole piece 4a when the magnetophoretic velocity (volume magnetic susceptibility) of a nanoscale particle p is to be obtained. Therefore, the amounts of protrusion of the first and second joint portions 22a and 22b are designed so as to allow the first pole piece 3a to move toward the second pole piece 4a to a position where the magnetophoretic velocity of a nanoscale particle p can be obtained. In addition, the first pole piece 3a is positioned furthest away from the second pole piece 4a when the zeta potential is to be obtained. Specifically, the first pole piece 3a is moved away from the second pole piece 4a to a position where a particle p to be measured does not undergo magnetophoresis. Therefore, the amounts of protrusion of the first and second joint portions 22a and 22b are designed so as to prevent the first and second joint portions 22a and 22b from falling from the first and second pole pieces 3a and 4a when the first pole piece 3a is moved to such a position that a particle p to be measured does not undergo magnetophoresis.

In the foregoing, the seventh embodiment has been described. According to the seventh embodiment, the measurement cell 10 is more easily provided.

Although in the seventh embodiment, the first and second joint portions 22a and 22b extend along the body portion 21, the first and second joint portions 22a and 22b may not extend along the body portion 21. The first and second joint portions 22a and 22b may have any shape that allows them to be supported by the first and second pole pieces 3a and 4a. For example, the first and second joint portions 22a and 22b may be provided at only portions of the top plate portion 22 corresponding to the first and second pole pieces 3a and 4a.

In addition, although in the seventh embodiment, the first and second protruding pieces 3 and 4 are a pole piece (the first and second pole pieces 3a and 4a), the first and second protruding pieces 3 and 4 may not be a pole piece. In other words, the first and second protruding pieces 3 and 4 may be formed of a material different from a magnetic material.

In addition, the measurement cell 10 (body portion 21) may have a curved shape, except for a region where the particle p is observed. The cross-sectional shapes of the body portion 21 and the flow channel 10a are not limited to a rectangular shape. For example, the body portion 21 and the flow channel 10a may have a semi-circular cross-sectional shape.

In addition, although in the seventh embodiment, an embodiment has been described in which the solution s is introduced into the flow channel 10a through capillary action, the solution s may be introduced into the flow channel 10a using, for example, a pump. Alternatively, the solution s may be introduced into the flow channel 10a using, for example, the siphon principle.

Eighth Embodiment

Figure 16:
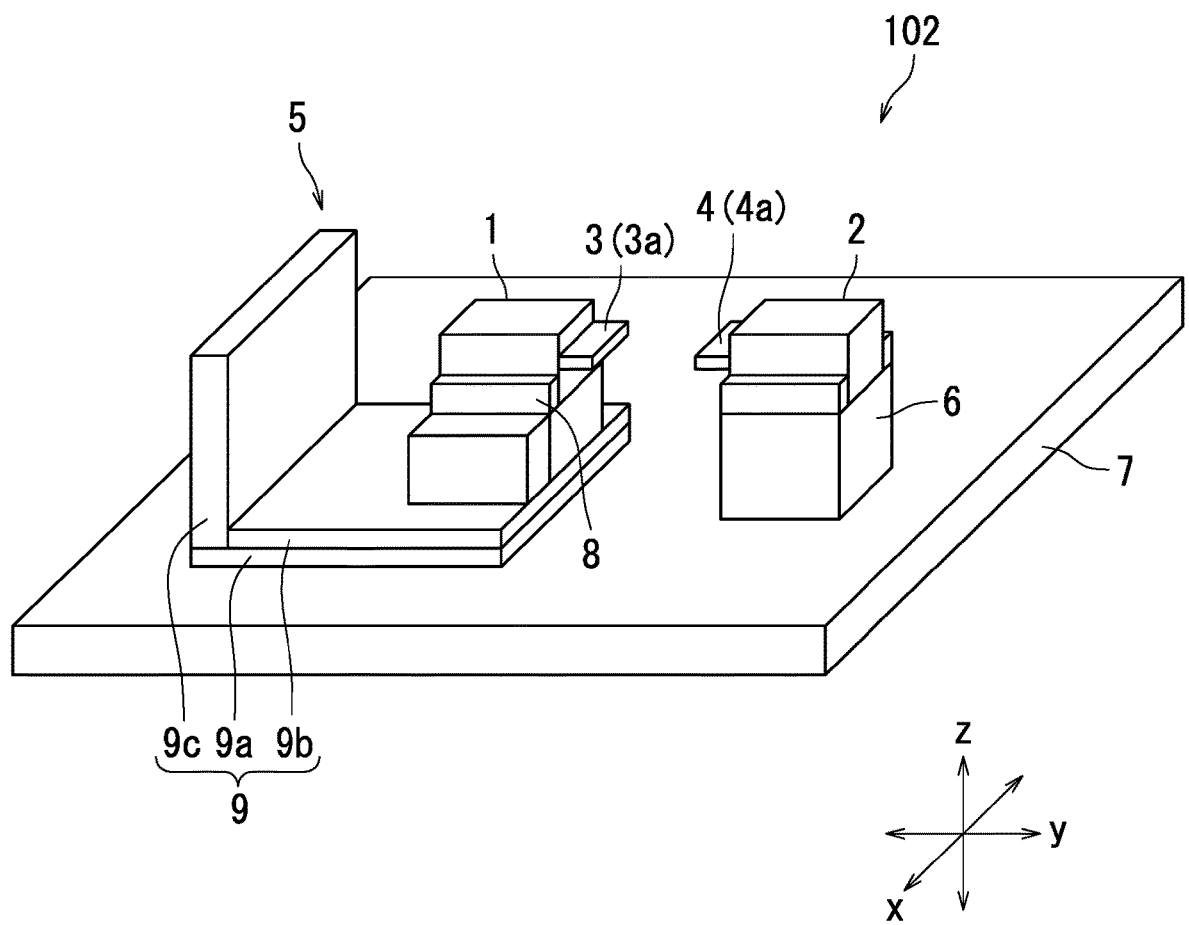
FIG. 16 is a perspective view showing a particle separation device according to an eighth embodiment of the present invention.

Next, an embodiment (eighth embodiment) of the particle separation device of the present invention will be described with reference to FIGS. 16 and 17. FIG. 16 is a perspective view showing a particle separation device 102 according to the eighth embodiment. The particle separation device 102 is different from the magnetic field generation device 100 described above with reference to FIG. 1 in that the movable stage 9 is a three-axis stage (so-called XYZ stage). Specifically, the movable stage 9 includes a third stage 9c in addition to the first and second stages 9a and 9b.

The third stage 9c is fixed to the first stage 9a. The second stage 9b is supported by the third stage 9c in a manner that allows the second stage 9b to move in the x-direction. The third stage 9c moves the second stage 9b in the z-direction. By the third stage 9c moving the second stage 9b in the z-direction, the first magnet 1 and the first pole piece 3a are moved in the z-direction.

The third stage 9c adjusts the position in the z-direction of the first pole piece 3a (first magnet 1) in relation to the second pole piece 4a (second magnet 2). By adjusting the position in the z-direction of the first pole piece 3a (first magnet 1), the magnetic field can be distorted. Therefore, particles p can be separated by magnetophoresis using the distorted magnetic field.

Figure 17:
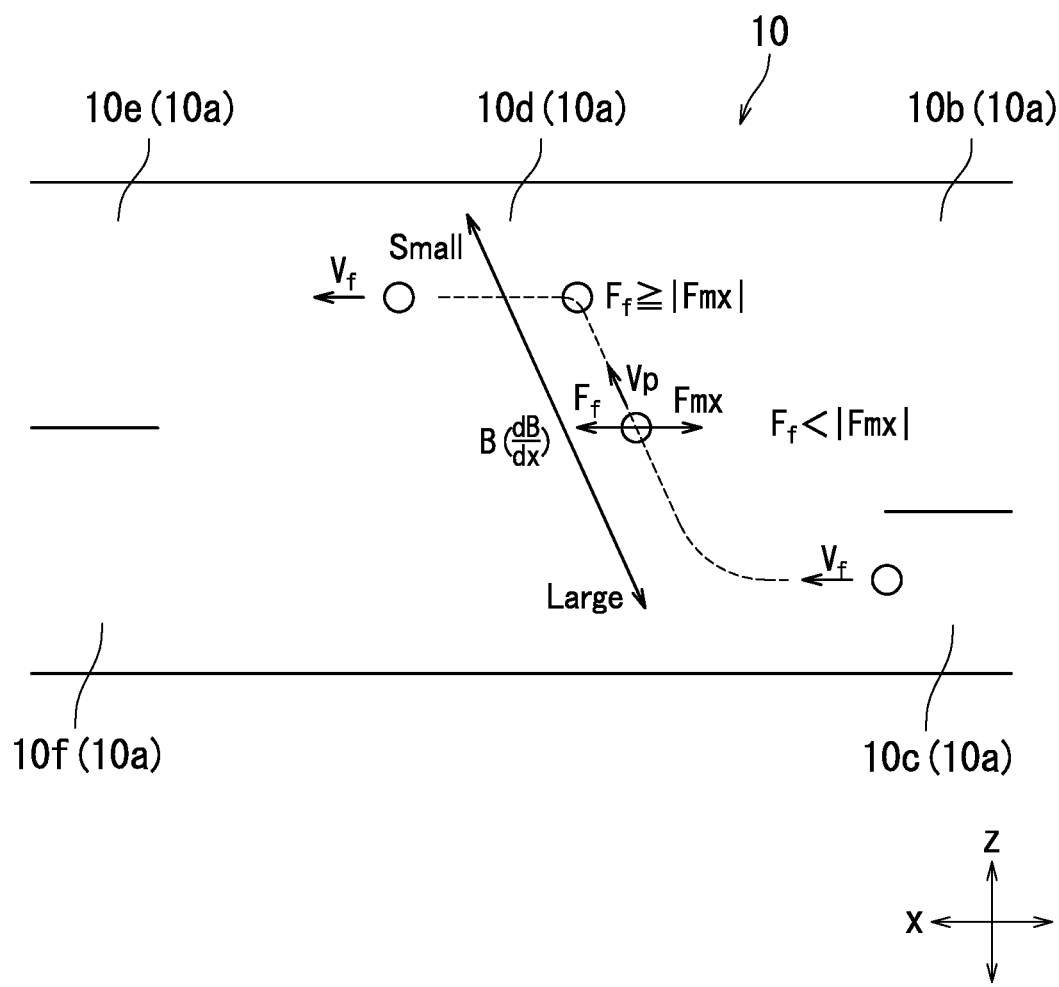
FIG. 17 is a diagram showing a measurement cell according to the eighth embodiment of the present invention.

FIG. 17 is a diagram showing a measurement cell 10 according to the eighth embodiment. Specifically, FIG. 17 shows an arrangement of the measurement cell 10 in the case where the volume magnetic susceptibility of the particle p is smaller than the volume magnetic susceptibility of the solvent m.

A flow channel 10a of the measurement cell 10 of the eighth embodiment includes a solvent introduction portion 10b, a particle introduction portion 10c, a particle separation portion 10d, a first particle discharge portion 10e, and a second particle discharge portion 10f. The measurement cell 10 is disposed so that the particle separation portion 10d is positioned in a region where a generated magnetic field gradient (magnetic flux density gradient) exists.

The particle separation device 102 described above with reference to FIG. 16 generates a magnetic field whose intensity varies depending on position in the z-direction (the width direction of the measurement cell 10). Therefore, the value of the product B(dB/dx) of the magnetic flux density and the magnetic flux density gradient varies depending on position in the z-direction. In the eighth embodiment, the position in the z-direction of the first pole piece 3a is adjusted so that the value of the product B(dB/dx) of the magnetic flux density and the magnetic flux density gradient substantially monotonically changes in the z-direction.

The solvent introduction portion 10b is disposed corresponding to a region in the z-direction where the value of the product B(dB/dx) of the magnetic flux density and the magnetic flux density gradient is relatively small. The particle introduction portion 10c is disposed corresponding to a region in the z-direction where the value of the product B(dB/dx) of the magnetic flux density and the magnetic flux density gradient is relatively large.

The first particle discharge portion 10e is disposed corresponding to a region in the z-direction where the value of the product B(dB/dx) of the magnetic flux density and the magnetic flux density gradient is relatively small. The second particle discharge portion 10f is disposed corresponding to a region in the z-direction where the value of the product B(dB/dx) of the magnetic flux density and the magnetic flux density gradient is relatively large.

A pump is coupled to the entrance of the solvent introduction portion 10b. A solvent m is driven by the pump to be introduced from the solvent introduction portion 10b into the particle separation portion 10d. Therefore, the solvent m flows in the longitudinal direction (the x-direction) of the flow channel 10a (capillary) of the measurement cell 10, more particularly in the positive x-direction. The particle introduction portion 10c drives a solution s (the solvent m in which particles p are dispersed) through capillary action to be introduced into the particle separation portion 10d. The particles p merge into the solvent m introduced from the solvent introduction portion 10b before reaching near a region where a generated magnetic field exists.

The particles p each receive a fluid driving force $F_f$ from the solvent m introduced from the solvent introduction portion 10b, and flow in the longitudinal direction of the flow channel 10a of the measurement cell 10, more particularly in the positive x-direction. As a result, the particles p each move at a flow rate $V_f$, and reach near the region where the generated magnetic field exists.

The particles p, having reached near the first and second pole pieces 3a and 4a (first and second magnets 1 and 2), each receive a magnetic force. In the eighth embodiment, the volume magnetic susceptibility of a particle p is smaller than the volume magnetic susceptibility of the solvent m, the magnetic force acts on the particle p in a direction in which the particle p is pushed back against the flow of the solvent m. The magnetic force exerted on the particle p varies depending on position in the z-direction. Specifically, as the value of the product B(dB/dx) of the magnetic flux density and the magnetic flux density gradient decreases, the component Fmx in the x-direction of the magnetic force exerted on the particle p decreases.

The particles p, having reached near the first and second pole pieces 3a and 4a (first and second magnets 1 and 2), each receive a magnetic force greater than the fluid driving force $F_f$. As a result, the particles p each move in a direction that is represented by the addition of the vector representing the fluid driving force $F_f$ and the vector representing the magnetic force. Typically, the particles p each move in an oblique direction with respect to the z-direction. As a particle p further moves obliquely, the magnetic force Fmx exerted on the particle p decreases. When the magnetic force Fmx exerted on the particle p is substantially equal to the fluid driving force $F_f$ exerted on the particle p received from the solvent m, the particle p passes through the region where the generated magnetic field gradient exists.

In the case where the volume magnetic susceptibility of the particle p is relatively small, i.e. the difference between the volume magnetic susceptibility of the solvent m and the volume magnetic susceptibility of the particle p is relatively large, the magnetic force Fmx is relatively great. As a result, the particle p moves across a relatively long distance in the z-direction (the width direction of the measurement cell 10) before passing through the region where the generated magnetic field gradient exists. Therefore, the particle p flows into the first particle discharge portion 10e after passing through the region where the generated magnetic field gradient exists.

Conversely, in the case where the volume magnetic susceptibility of the particle p is relatively large, i.e. the difference between the volume magnetic susceptibility of the solvent m and the volume magnetic susceptibility of the particle p is relatively small, the magnetic force Fmx is relatively small. As a result, the particle p moves across a relatively short distance in the z-direction before passing through the region where the generated magnetic field gradient exists. Therefore, the particle p flows into the second particle discharge portion 10f after passing through the region where the generated magnetic field gradient exists.

In the foregoing, the eighth embodiment has been described. According to the eighth embodiment, particles p can be separated by causing the particles p to move in the z-direction, depending on the volume magnetic susceptibility of each of the particles p. Therefore, for example, a normal cell can be separated from a cancer cell.

Although in the eighth embodiment, the flow channel 10a of the measurement cell 10 is divided into two flow channels (the first particle discharge portion 10e and the second particle discharge portion 10f) at a downstream portion in the direction in which the solvent m flows, the flow channel 10a of the measurement cell 10 may be divided into three or more flow channels at a downstream portion in the direction in which the solvent m flows.

In the foregoing, embodiments of the present invention have been described with reference to the drawings. Note that the present invention is not limited to the above embodiments, and may be carried out in various embodiments without departing the scope and spirit of the present invention.

For example, although in the embodiments of the present invention, images are analyzed to obtain the movement velocity of a particle p, the method for obtaining the movement velocity of a particle p is not limited to the image analysis method. For example, a configuration shown in FIG. 18 may be used to obtain the movement velocity of a particle p. Another embodiment of the analysis apparatus of the present invention will now be described with reference to FIG. 18.

Figure 18:
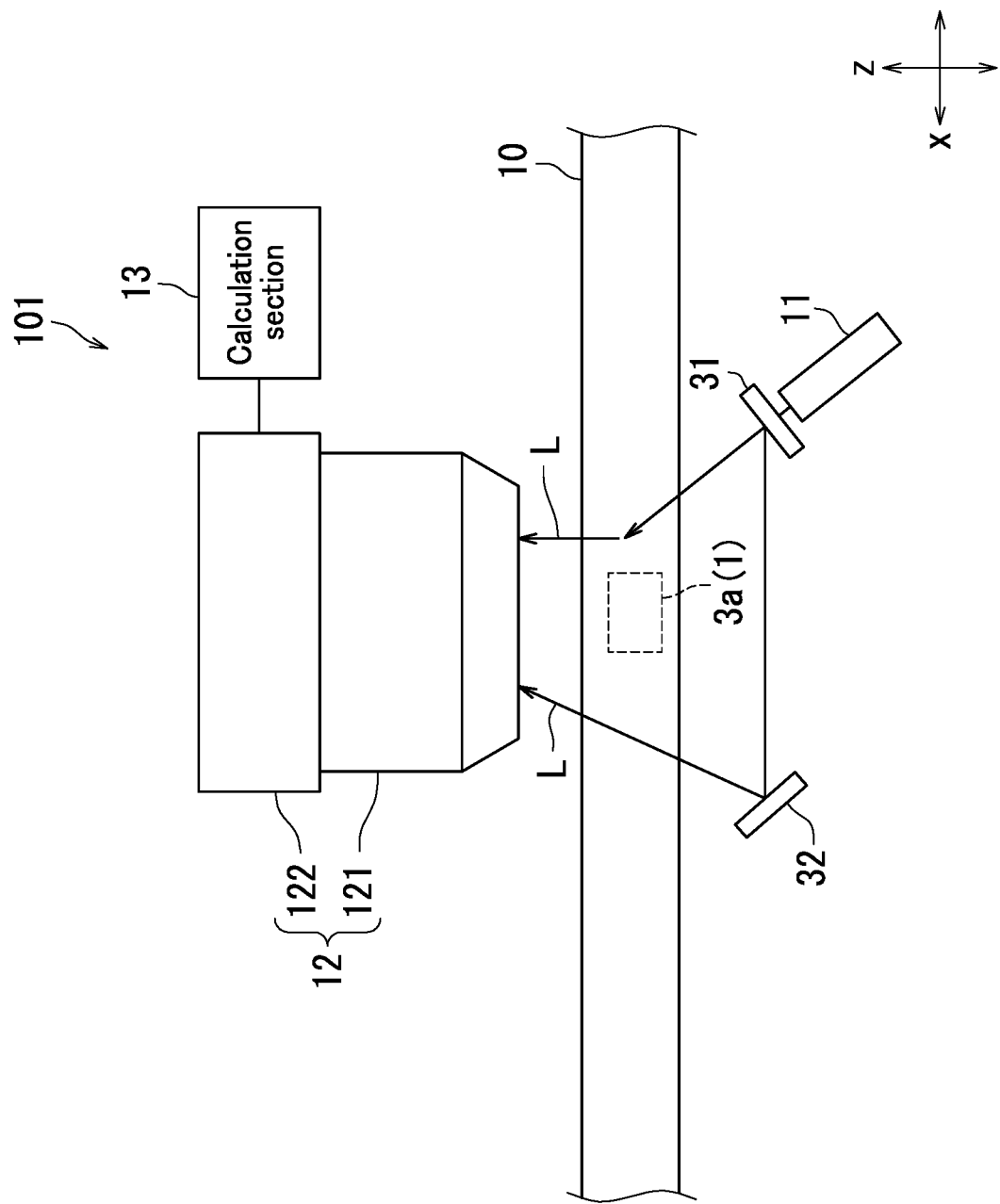
FIG. 18 is a diagram showing a portion of the configuration of an analysis apparatus according to another embodiment of the present invention.

FIG. 18 is a diagram showing a portion of the configuration of an analysis apparatus 101 according to another embodiment of the present invention. The analysis apparatus 101 of FIG. 18 analyzes a change in the frequency of scattered light by heterodyning to measure the movement velocity of a particle p. Specifically, the analysis apparatus 101 of FIG. 18 is further provided with a diffraction grating 31. In addition, the analysis apparatus 101 of FIG. 18 is further provided with a mirror 32. Note that a one-way mirror may be used instead of the diffraction grating 31. In addition, the mirror 32 may be removed in some optical system design.

The diffraction grating 31 is disposed between a laser light source 11 and a measurement cell 10. Laser light L emitted by the laser light source 11 enters the diffraction grating 31. A portion of the laser light L diffracted by the diffraction grating 31 enters the measurement cell 10.

The laser light L entering the measurement cell 10 is emitted to the particle p. Specifically, the laser light L entering the measurement cell 10 enters a region where a magnetic flux density gradient generated by the magnetic field generation device 100 exists. The detection section 12 detects the laser light L (scattered light) scattered by a particle p.

In addition, another portion of the laser light L diffracted by the diffraction grating 31 is detected as reference light by the detection section 12 without passing through the measurement cell 10. In this embodiment, the reference light is guided by the mirror 32 into the detection section 12.

The detection section 12 detects light that is a combination of the scattered light and the reference light. As a result, the detection section 12 outputs a signal indicating the frequency of light that is a combination of the scattered light and the reference light. By analyzing a change in the frequency of light that is a combination of the scattered light and the reference light, the calculation section 13 obtains the movement velocity of the particle p.

The analysis apparatus 101 of FIG. 18 can be used to obtain the movement velocity of the particle p even when the solution s is flowing in the measurement cell 10 (flow channel 10a). Note that in the analysis apparatus 101 of FIG. 18, the calculation section 13 can analyze the spectrum of light that is a combination of the scattered light and the reference light to measure the particle size of the particle p. Therefore, the particle size of the particle p can be obtained even when the solution s is flowing in the measurement cell 10.

INDUSTRIAL APPLICABILITY

The present invention is useful for a device for analyzing a particle.

REFERENCE SIGNS LIST 1 first magnet
2 second magnet
3 first protruding piece
3a first pole piece
4 second protruding piece
4a second pole piece
5 position adjustment mechanism
8 vise
9 movable stage
9a first stage
9b second stage
9c third stage 10 measurement cell
10a flow channel
11 laser light source
11a first laser light source
11b second laser light source
12 detection section
12a first detection section
12b second detection section
13 calculation section
14 first electrode
15 second electrode
16 power supply
17 light source
17a first light source
17b second light source
22a first joint portion
22b second joint portion
100 magnetic field generation device
100a first magnetic field generation device
100b second magnetic field generation device
101 analysis apparatus
102 particle separation device
L laser light
La light
p particle

The invention claimed is:

1. A magnetic field generation device comprising:
a first magnet;
a second magnet configured to, together with the first magnet, generate a magnetic field;
a fixation member configured to hold the second magnet at a specific position; and
a position adjustment mechanism configured to adjust a position of the first magnet, wherein
the position adjustment mechanism includes:
    a jig that is not connected to the fixation member and that is configured to hold the first magnet at the position; and
    a movable stage to which the jig is fixed and that is movable in a direction in which the first magnet moves toward the second magnet and a direction in which the first magnet moves away from the second magnet, and
a value of a product of a magnetic flux density and a magnetic flux density gradient in the magnetic field is controlled through the adjustment of the position of the first magnet by the position adjustment mechanism.

2. The magnetic field generation device according to claim 1, wherein
a space between the first and second magnets is open to a space external thereto, except for a direction in which the first and second magnets are aligned.

3. The magnetic field generation device according to claim 1, further comprising:
a first protruding piece protruding from a surface of the first magnet closer to the second magnet; and
a second protruding piece protruding from a surface of the second magnet closer to the first magnet.

4. The magnetic field generation device according to claim 3, wherein
the first and second protruding pieces are pole pieces.

5. A measurement cell for use in the magnetic field generation device according to claim 3, comprising:
a first joint portion joined to the first protruding piece; and
a second joint portion joined to the second protruding piece, wherein the measurement cell is supported by the first and second protruding pieces with the first joint portion joined to the first protruding piece and the second joint portion joined to the second protruding piece.

6. An analysis apparatus comprising:
a migration section configured to allow an object to be measured to migrate in a flow channel;
a detection section configured to detect a motion of the object to be measured in the flow channel; and
a calculation section configured to obtain a movement velocity of the object to be measured from the motion of the object to be measured detected by the detection section, wherein
the migration section includes the magnetic field generation device according to claim 1,
the detection section detects the motion of the object to be measured during magnetophoresis caused by the magnetic field generated by the magnetic field generation device,
the calculation section obtains a magnetophoretic velocity of the object to be measured from the motion of the object to be measured during magnetophoresis detected by the detection section, and
the calculation section obtains the volume magnetic susceptibility of the object to be measured from the radius and magnetophoretic velocity of the object to be measured.

7. The analysis apparatus according to claim 6, wherein
the position adjustment mechanism of the magnetic field generation device moves the first magnet further away from the second magnet to a position where the object to be measured is not allowed to undergo magnetophoresis,
the migration section further includes an electric field generation device configured to generate an electric field that allows the object to be measured to undergo electrophoresis,
the detection section detects a motion of the object to be measured during electrophoresis, in the same region in which the motion of the object to be measured is detected during magnetophoresis,
the calculation section obtains an electrophoretic velocity of the object to be measured from the motion of the object to be measured during electrophoresis detected by the detection section, and
the calculation section obtains the zeta potential of the object to be measured from the electrophoretic velocity.

8. The analysis apparatus according to claim 6, wherein
the detection section detects a motion of the object to be measured in two regions included in the region where the object to be measured undergoes magnetophoresis,
the calculation section obtains a first movement velocity of the object to be measured from the motion of the object to be measured in one of the two regions, and obtains a second movement velocity of the object to be measured from the motion of the object to be measured in the other region of the two regions, and
the calculation section obtains the volume magnetic susceptibility of the object to be measured on the basis of a difference between the first and second movement velocities and a difference in the value of the product of the magnetic flux density and the magnetic flux density gradient between the two regions.

9. The analysis apparatus according to claim 8, wherein
the flow channel extends in a vertical direction,
the calculation section obtains a magnetophoretic velocity of the object to be measured in one or the other of the two regions on the basis of the radius and volume magnetic susceptibility of the object to be measured, the calculation section obtains a gravitational settling velocity of the object to be measured on the basis of the first or second movement velocity, and the magnetophoretic velocity of the object to be measured in one or the other of the two regions, the calculation section obtains the specific gravity or mass of the object to be measured from the gravitational settling velocity, and the gravitational settling velocity indicates a velocity at which the object to be measured, receiving a gravitational field-derived force, settles.

10. The analysis apparatus according to claim 8, wherein the position adjustment mechanism of the magnetic field generation device moves the first magnet further away from the second magnet to a position where the object to be measured is not allowed to undergo magnetophoresis, the migration section further includes an electric field generation device configured to generate an electric field that allows the object to be measured to undergo electrophoresis, the detection section detects a motion of the object to be measured during electrophoresis in the same regions as the two regions, the calculation section obtains an electrophoretic velocity of the object to be measured from a difference between the first and second movement velocities, and the calculation section obtains the zeta potential of the object to be measured from the electrophoretic velocity.

11. The analysis apparatus according to claim 6, wherein the migration section includes two of the magnetic field generation devices, the two magnetic field generation devices generate two magnetic fields having different values of the product of the magnetic flux density and the magnetic flux density gradient, the detection section detects a motion of the object to be measured during magnetophoresis in the two regions where the generated magnetic fields exist, the calculation section obtains a first movement velocity of the object to be measured from the motion of the object to be measured in one of the two regions, and obtains a second movement velocity of the object to be measured from the motion of the object to be measured in the other region of the two regions, and the calculation section obtains the volume magnetic susceptibility of the object to be measured on the basis of a difference between the first and second movement velocities and a difference in the value of the product of the magnetic flux density and the magnetic flux density gradient between the two regions.

12. The analysis apparatus according to claim 11, wherein the flow channel extends in a vertical direction, the calculation section obtains a magnetophoretic velocity of the object to be measured depending on one of the two magnetic fields, on the basis of the radius and volume magnetic susceptibility of the object to be measured, the calculation section obtains a gravitational settling velocity of the object to be measured on the basis of the first or second movement velocity, and the magnetophoretic velocity of the object to be measured depending on one of the two magnetic fields, the calculation section obtains the specific gravity or mass of the object to be measured from the gravitational settling velocity, and the gravitational settling velocity indicates a velocity at which the object to be measured, receiving a gravitational field-derived force, settles.

13. The analysis apparatus according to claim 11, wherein the position adjustment mechanisms of the two magnetic field generation devices each move the first magnet further away from the second magnet to a position where the object to be measured is not allowed to undergo magnetophoresis, the migration section further includes an electric field generation device configured to generate an electric field that allows the object to be measured to undergo electrophoresis, the detection section detects a motion of the object to be measured during electrophoresis in the same two regions where the magnetic fields are generated, the calculation section obtains an electrophoretic velocity of the object to be measured from a difference between the first and second movement velocities, and the calculation section obtains the zeta potential of the object to be measured from the electrophoretic velocity.

14. A particle separation device comprising:

a first magnet;

a second magnet configured to, together with the first magnet, generate a magnetic field;

a fixation member configured to hold the second magnet at a specific position; and a position adjustment mechanism configured to adjust a position of the first magnet, wherein the position adjustment mechanism includes:
- a jig that is not connected to the fixation member and that is configured to hold the first magnet at the position; and
- a three-axis stage to which the jig is fixed and that is movable in directions along three axes thereof, and the magnetic field is distorted through the adjustment of the position of the first magnet by the position adjustment mechanism.

* * * * *